United States Patent [19]

Kajihara et al.

[11] Patent Number: 5,378,656

[45] Date of Patent: Jan. 3, 1995

[54] LEADFRAME, SEMICONDUCTOR INTEGRATED CIRCUIT DEVICE USING THE SAME, AND METHOD OF AND PROCESS FOR FABRICATING THE SAME

[75] Inventors: Yujiro Kajihara, Tachikawa; Kazunari Suzuki, Tokyo; Kunihiro Tsubosaki, Hino; Hiromichi Suzuki, Machida; Yoshinori Miyaki, Kokubunji; Takahiro Naito, Koganei; Sueo Kawai, Iwama, all of Japan

[73] Assignees: Hitachi, Ltd., Tokyo; Hitachi Microcomputer System Ltd., Ibaraki, Japan

[21] Appl. No.: 38,684

[22] Filed: Mar. 29, 1993

[30] Foreign Application Priority Data

Mar. 27, 1992 [JP] Japan .................. 4-071116
Nov. 30, 1992 [JP] Japan .................. 4-320098

[51] Int. Cl.6 ............................ H01L 21/60
[52] U.S. Cl. ................. 437/217; 437/209; 437/211; 437/214; 437/220
[58] Field of Search ............ 437/209, 211, 214, 217, 437/220

[56] References Cited

U.S. PATENT DOCUMENTS

| 4,534,105 | 8/1985 | Reusch ..................... 357/70 |
| 4,829,362 | 5/1989 | Tran et al. ................. 437/217 |
| 4,835,120 | 5/1989 | Mallik et al. .............. 437/209 |
| 4,868,635 | 9/1989 | Frechette et al. ........ 357/70 |
| 5,083,186 | 1/1992 | Okada et al. ............. 437/220 |
| 5,177,032 | 1/1993 | Fogal et al. .............. 437/220 |
| 5,256,598 | 10/1993 | Farnworth et al. ....... 437/217 |

FOREIGN PATENT DOCUMENTS

| 92535 | 5/1984 | Japan . |
| 204753 | 8/1988 | Japan . |
| 74065 | 3/1990 | Japan . |
| 83961 | 3/1990 | Japan . |

OTHER PUBLICATIONS

"Nikkei Microdevices, December, 1987", pp. 76–78 (with English language translation).

Primary Examiner—Tom Thomas
Assistant Examiner—Kevin M. Picardat
Attorney, Agent, or Firm—antonelli, Terry, Stout & Kraus

[57] ABSTRACT

In order to improve the package body cracking resistance of an LSI package at the reflow soldering and to provide both a leadframe suitable for fabricating the LSI package according to the flexible manufacturing system and an LSI using the leadframe, the adhered area between a semiconductor chip 2 and a resin is enlarged by making the external size of a die pad 3 smaller than that of the semiconductor chip to be mounted thereon. Moreover, a variety of semiconductor chips 2 having different external sizes can be mounted on the die pad 3 by cutting the leading ends of leads 5 to a suitable length in accordance with the external sizes of the semiconductor chips 2.

23 Claims, 21 Drawing Sheets

LEADFRAME, SEMICONDUCTOR INTEGRATED CIRCUIT DEVICE USING THE SAME, AND METHOD OF AND PROCESS FOR FABRICATING THE SAME

BACKGROUND OF THE INVENTION

The present invention relates to a leadframe for mounting a semiconductor chip, a semiconductor integrated circuit device using the same, and a method of and process for fabricating the same. More particularly, the present invention relates to a technology which is effective when applied for standardizing the leadframe and for improving the reflow cracking resistance of an LSI package.

The resin body, i.e., LSI package of a surface mounting type resin molded device (or surface mount device) such as a QFP (i.e., quad Flat Package) has an important target of suppressing the package cracking (i.e., resin body cracking) in a reflow soldering step.

In case the resin body (i.e., plastic body) of the LSI package absorbs moisture, the interface between the resin and a die pad will peel due to the internal stress which is caused by the high temperature at the reflow soldering step for heating the LSI package in its entirety. This package cracking is a stet wherein the peeling is enlarged by the expansion of the moisture condensed at the die pad interface, i.e., the water vapor pressure contributes to cracking of the resin body. This phenomenon causes the deterioration of moisture resistance and an insufficient soldering due to the bulging of the package body. If this package cracking takes place on the face of the semiconductor chip, it will cause a serious defect such as the breakage of wires.

As the existing counter-measures for preventing the peel of the interface between the resin and the die pad, there is known either a method (as disclosed in Japanese Patent Laid-Open No. 83961/1990), in which the die pad is partially formed with through holes so that the back of the semiconductor chip and the resin may be held in close contact through those through holes, or a method in which the adhesion between the resin and the die pad is improved by dimpling the back face of the die pad.

On the other hand, even the chips having an equal pin number but different sizes, e.g., an ASIC (i.e., Application Specific Integrated Circuit) having a small production number for one kind are required to be capable of packaging density, and it is a tendency that the chip be mounted on the surface mounted LSI package such as the aforementioned QFP. In the prior art, therefore, the products have been manufactured by fabricating a leadframe according to the chip size so that their production cost are raised.

As the leadframe capable of corresponding to the ASIC of various chip sizes but a small production number, therefore, there is disclosed on pp. 76 to 78 of "Nikkei MICRODEVICES, December, 1987" a leadframe, in which a semiconductor chip is mounted on a tape of a polyimide resin attached as the die pad to the inner leads.

SUMMARY OF THE INVENTION

In the LSI packages of recent years, however, the ratio of the area of the package body occupied by the semiconductor chip increases more and more. Since the resin is made far thinner than that of the prior LSI package, the aforementioned counter-measures, i.e., the method of forming the through holes in the die pad or dimpling the die pad has found it difficult to prevent the package body cracking effectively.

Moreover, investigations have been made not by forming a leadframe according to the chip size but by using the leadframe of the prior art, i.e., the leadframe in which the external size (i.e., the area of the chip mounting face) of the die pad is made larger than that (i.e., the area of the principal or back face) of the semiconductor chip. However, these investigations have revealed that a considerable restriction is exerted upon the size of the chip to be mounted on the die pad. Specifically, if there is mounted a semiconductor chip having an external size smaller by 1 to 2 mm or more than that of the die pad, the wires will hang as far as to contact with the die pad ends thereby to cause a wire bonding defect. This makes it impossible to use a relatively small chip. On the other hand, the positions of the leading ends of the inner leads are restricted by the die pad, and the length of the wires are also restricted (or determined to a suitable value of 1.0 mm to 5.0 mm by the performance of the wire bonder or by the electric characteristics) so that the relatively small chip cannot be used. On the other hand, the size of the chip to be mounted is limited to the external size of the die pad to raise an upper limit to the chip size.

The aforementioned die pad, which is prepared by adhering the tape of polyimide resin to the inner leads, has no restriction on the size of the chip. Since, however, the tape has a coefficient of thermal expansion different from those of the leadframe and the semiconductor chip, a peel may take place at their interface due to the difference in the coefficients of thermal expansion at the soldering reflow step thereby to cause the package body cracking. This makes it necessary to provide a package which can prevent the interface peel and the package body cracking and mounting a variety of chip sizes.

It is, therefore, an object of the present invention to provide a technology capable of improving the package body cracking resistance of the LSI package at the reflow soldering.

Another object of the present invention is to provide a leadframe which can correspond to the flexible manufacturing system of the LSI.

Still another object of the present invention is to provide a semiconductor integrated circuit device using the aforementioned leadframe and a technology for fabricating the same.

Representatives of the invention to be disclosed herein will be summarized in the following.

(1) According to the present invention, there is provided a leadframe in which the external size of a die pad for mounting a semiconductor chip is made smaller than that of the semiconductor chip and in which the leading ends of leads can be cut to a predetermined length in accordance with the external size of the semiconductor chip.

Specifically, there is provided a leadframe capable of mounting a plurality of kinds of semiconductor chips having different sizes thereon, comprising:

a chip mounting portion for mounting a semiconductor chip having a predetermined size, and a suspension lead portion supporting said chip mounting portion;

a plurality of leads each including: an inner lead portion arranged to surround said chip mounting portion and having a region capable of being cut according to the size of the semiconductor chip to be mounted; and an outer lead portion connected with said inner lead portion and extending outward from said inner lead portion; and a plated layer having wires bonded thereto at said inner lead portions and formed in said cutting-capable region, wherein the area of the chip mounting region of said chip mounting portion is made smaller than that of the semiconductor chip to be mounted.

(2) According to the present invention, there is also provided a method of fabricating a leadframe capable of mounting a plurality of kinds of semiconductor chips having different sizes thereon, comprising the steps of:

preparing a sheet-shaped frame having a first face and a second face opposed to said first face;

cutting said frame in a direction from said first face to said second face, to form a chip mounting portion for mounting a semiconductor chip having a predetermined size, and a suspension lead portion supporting said chip mounting portion;

cutting said frame in a direction from said second face to said first face, to form an inner lead portion which is arranged to surround said chip mounting portion and has a region capable of being cut according to the size of the semiconductor chip to be mounted;

forming an outer lead portion which is connected with said inner lead portion and extends outward from said inner lead portion; and forming in said inner lead portion a plated layer which has wires bonded thereto at said inner lead portions and is formed in said cutting-capable region, wherein the area of the chip mounting region of said chip mounting portion is made smaller than that of the semiconductor chip to be mounted.

(3) According to the present invention, there is further provided a process for fabricating a semiconductor integrated circuit device by using a leadframe capable of mounting a plurality of kinds of semiconductor chips having different sizes thereon, comprising the steps of:

preparing a leadframe having a first face and a second face, said leadframe including: a chip mounting portion for mounting a semiconductor chip having a predetermined size; a plurality of suspension leads supporting said chip mounting portion; a plurality of inner lead portions arranged to surround said chip mounting portion and having regions capable of being cut according to the size of the semiconductor chip to be mounted; and outer lead portions individually connected with said inner lead portions and extending outward;

preparing a square-shaped semiconductor chip which has its principal face formed with an integrated circuit and a plurality of bonding pads;

bonding said semiconductor chip to said chip mounting portion;

electrically connecting said bonding pads and said inner lead portions individually; and sealing said semiconductor chip, said inner lead portions and said chip mounting portion, wherein the leading end portions of said inner lead portions are cut to correspond to the size of the semiconductor chip to be mounted, and wherein the first faces of said inner lead portions being formed with a plated layer which has wires bonded thereto at said inner lead portions and is formed in said cutting-capable region.

According to the means described above, the external size of the die pad is made smaller than that of the semiconductor chip to be mounted thereon, and the leading ends of the leads are cut to a predetermined length in accordance with the external size of the semiconductor chip to be mounted on the die pad. As a result, a variety of semiconductor chips having external sizes made different over a considerable wide range can be commonly used to provide a leadframe which matches the flexible manufacturing system of the LSI package.

More specifically, in case the leadframe of the prior art, i.e., the leadframe in which the external size of the die pad is larger than the chip size is used, the size of the chips to be commonly used is limited to a considerable small range (i.e., 1 to 2 mm from the contour of the tab to the chip end) so that the leading ends of the inner leads need not be cut. On the other hand, the leadframe of the present invention has a smaller die pad than the chip size so that it can commonly use chips of a wider size range (e.g., $5 \times 5$ mm to $15 \times 15$ mm). Thus, the leadframe of the present invention can sufficiently match the case in which the positions of the leading ends of the inner leads have to be changed according to the limits to the wire length.

Moreover, it is possible to provide a leadframe which can match the flexible manufacturing system of the LSI package. At the same time, the external size of the die pad is made smaller than that of the semiconductor chip so that the periphery of the semiconductor chip mounted on the die pad is adhered to the resin. Since this adhesion of the interface between the semiconductor chip (of silicon) and the resin is stronger than that of the interface between the die pad (of metal) and the resin, the moisture can be prevented from invading into the interface between the die pad and the resin. Thus, it is possible to suppress the package body cracking which might otherwise be caused when the LSI package is to be mounted on the substrate by the solder reflow.

DESCRIPTION OF THE PREFERRED EMBODIMENTS

Figure 1:
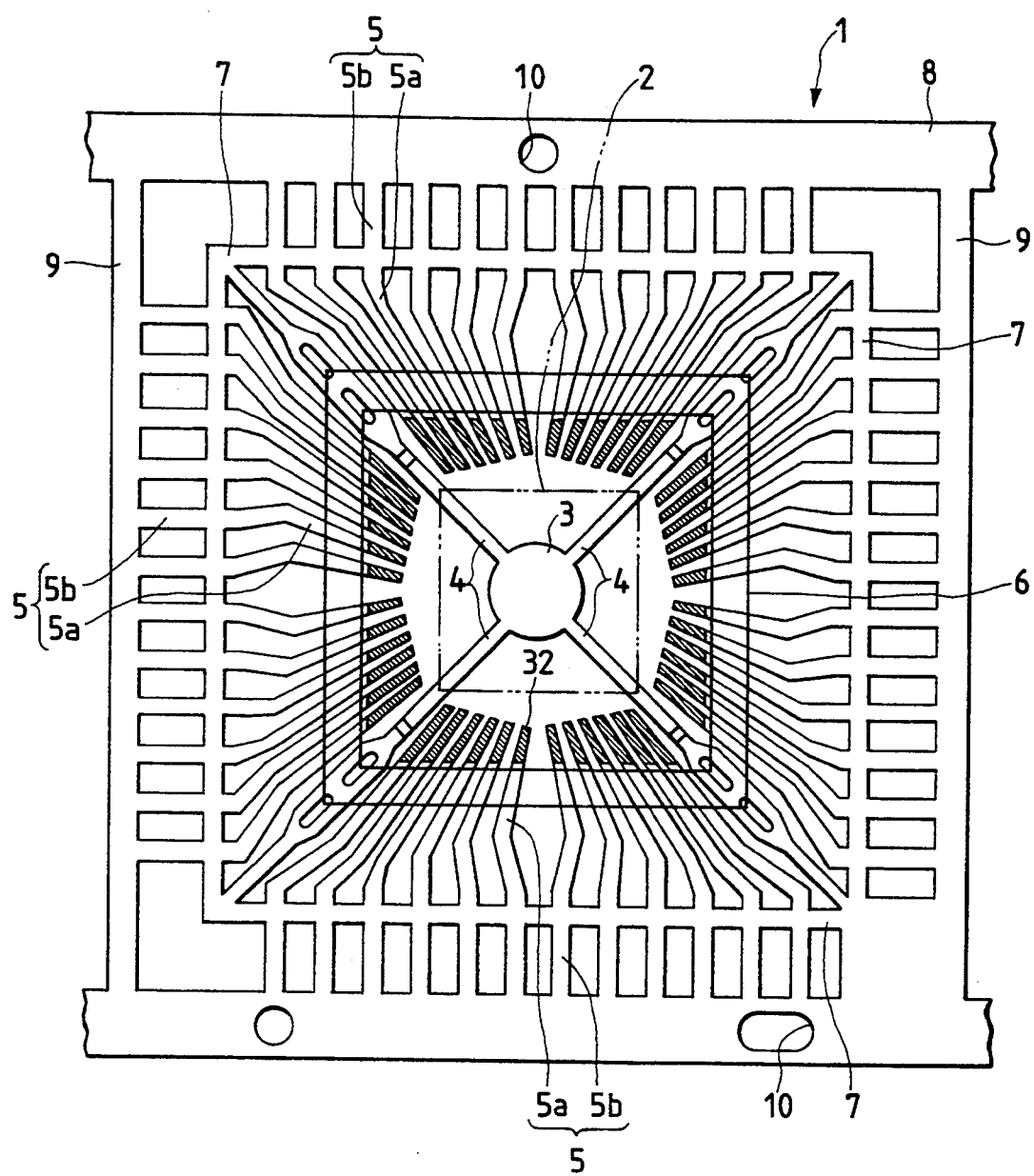
FIG. 1 is a top plan view showing a leadframe according to one embodiment of the present invention.

FIG. 1 is a top plan view showing a leadframe to be used for fabricating a QFP package according to one embodiment of the present invention.

A leadframe 1 is formed at its central portion with a circular die pad for mounting a semiconductor chip 2 which is formed with a semiconductor circuit and bonding pads on its principal face. The die pad 3 is supported by four suspension leads 4. The die pad 3 has its chip mounting face characterized to have a smaller area than that of the principal face of the semiconductor chip 2 mounted thereon.

The die pad 3 is arranged therearound with a plurality of leads 5. To the wider portions of the suspension leads 4 and the middle portions of the leads 5, there is adhered a quadrangular frame-shaped tape 6 which is made of an insulating, thin synthetic resin film. Outside of the tape 6, there is formed a dam bar 7 for supporting the leads 5 and preventing the resin from overflowing at a molding time. The dam bar 7 is formed into a frame shape to connect the individual leads 5.

The outermost periphery of the leadframe 1 is constructed of an outer frame 8 formed to connect a plurality of unit frames and an inner frame 9 formed to isolate the individual leadframes. The outer frame 8 is partially formed with guide holes for acting as guides when the leadframe 1 is to be positioned in the mold.

The aforementioned components of the leadframe 1, i.e., the die pad 3, the suspension leads 4, the leads 5, the dam bar 7, the outer frame 8 and the inner frame 9 are made of an electrically conductive material such as 42-alloy or copper. The portions of the leads 5, i.e., the inner lead portions 5a to be sealed with a resin have their leading ends plated with Ag. Although not shown, the leadframe 1 is constructed by juxtaposing a plurality of unit frames having those portions, in one direction.

Next, one embodiment of a method of fabricating the aforementioned leadframe 1 will be described with reference to FIGS. 2 to 10.

Figure 2:
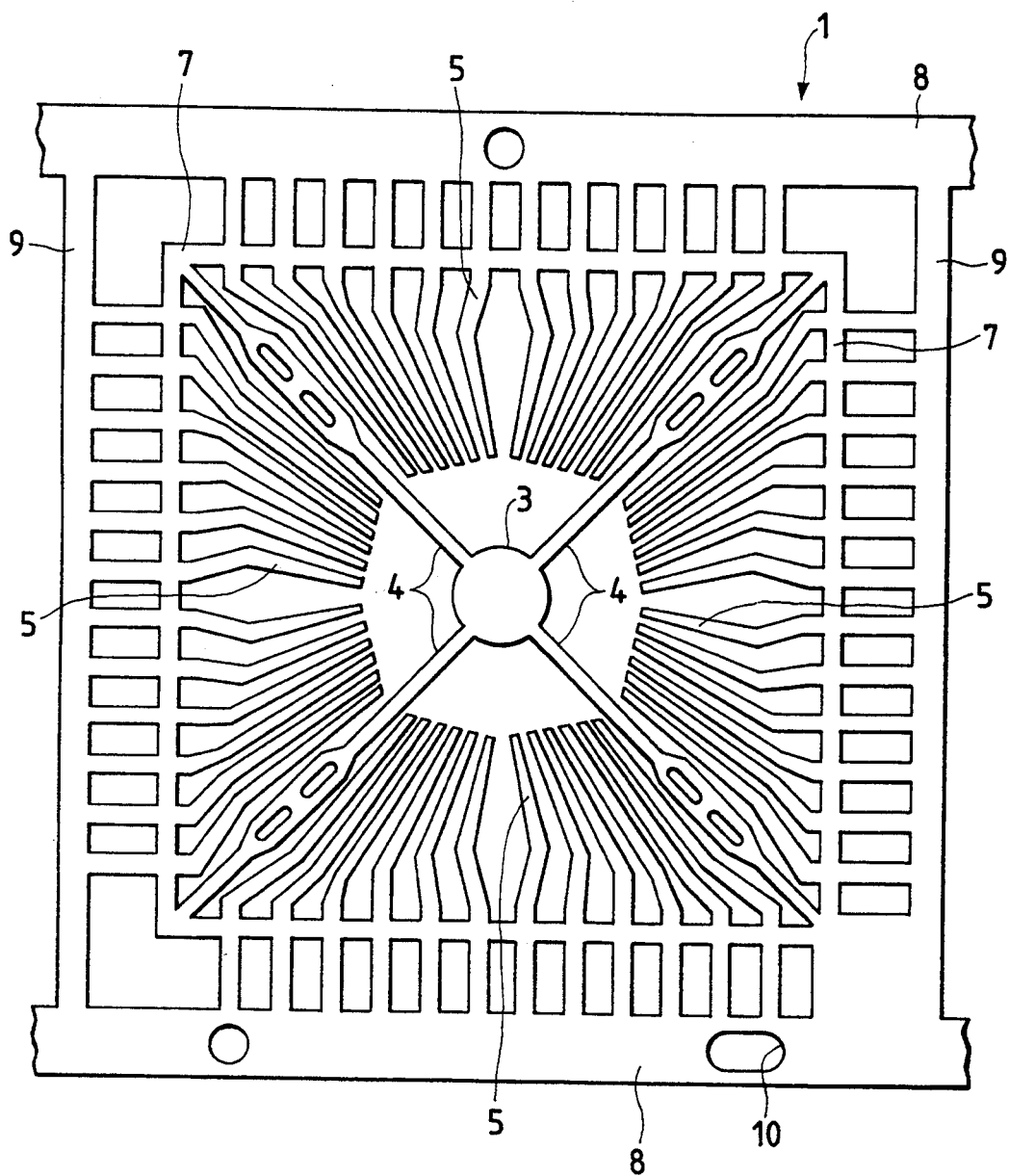
FIG. 2 is a top plan view showing a pressing step of the leadframe of the present invention.
Figure 3:
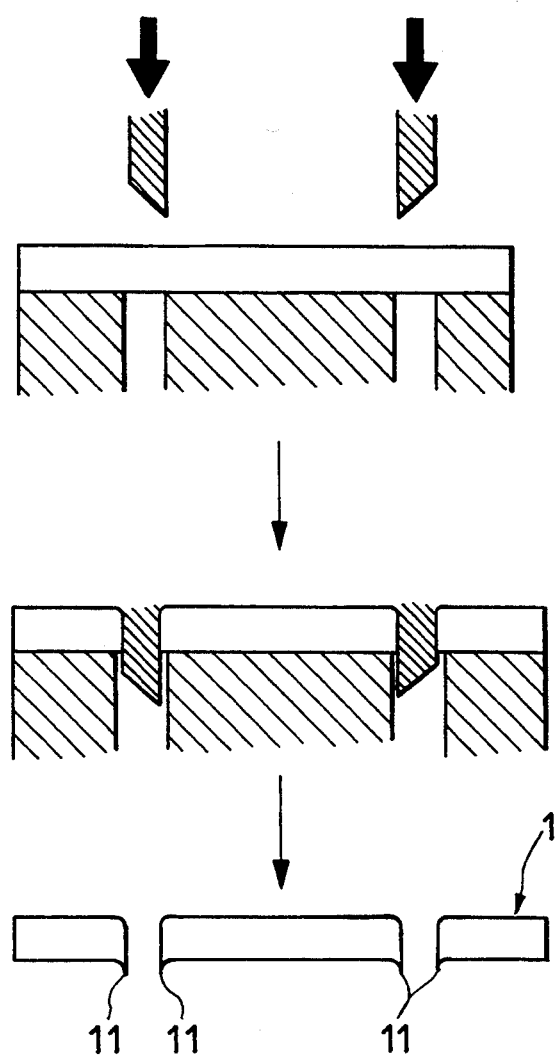
FIG. 3 is an explanatory diagram showing the pressing step of the leadframe of the present invention.

First of all, as shown in FIG. 2, a hoop material is pressed to form the die pad 3, the suspension leads 4, the leads 5 (composed of inner lead portions 5a and outer lead portions 5b), the dam bar 7, the outer frame 8, the inner frame 9, and the guide holes integrally. For example, the hoop material is made of 42-alloy having a film thickness of about 0.15 mm. And, the die pad 3 has a diameter of about 3 mm, and the suspension leads 4 have a width of about 0.3 mm. The inner lead portions 5a are given a pitch of about 0.22 mm for the leadframe of 132 pins and about 0.25 mm for the leadframe of 168 pins while considering the working limit. Moreover, the distance from the center of the die pad 3 to the leading ends of the inner leads 5a has the maximum of about 5 mm for the 132 pins and about 6.2 mm for the 168 pins.

In case the aforementioned individual portions are formed by the pressing, burrs 11 (FIG. 3) are left on the back of the cut portions. Since the leadframe 1 of the present embodiment is made such that the die pad 3 has a smaller area than that of the semiconductor chip 2 to be mounted thereon, the burrs 11, if any, on the face of the die pad 3 for mounting the semiconductor chip 2 will be unable to mount the chip 2. When the die pad 3 is to be pressed, therefore, it is pressed with its chip mounting face being directed upward so that the burrs 11 may be left on the back opposed to the chip mounting face.

On the other hand, the inner lead portions 5a are reluctant, if the burrs 11 are left at the lower side at a wire bonding step, to have wires bonded thereto so that the bonding is defective. When the inner lead portions 5a are to be pressed, the pressing is carried out downward with the bonding face being directed downward, to leave the burrs 11 on the wire bonding face.

Figure 4:
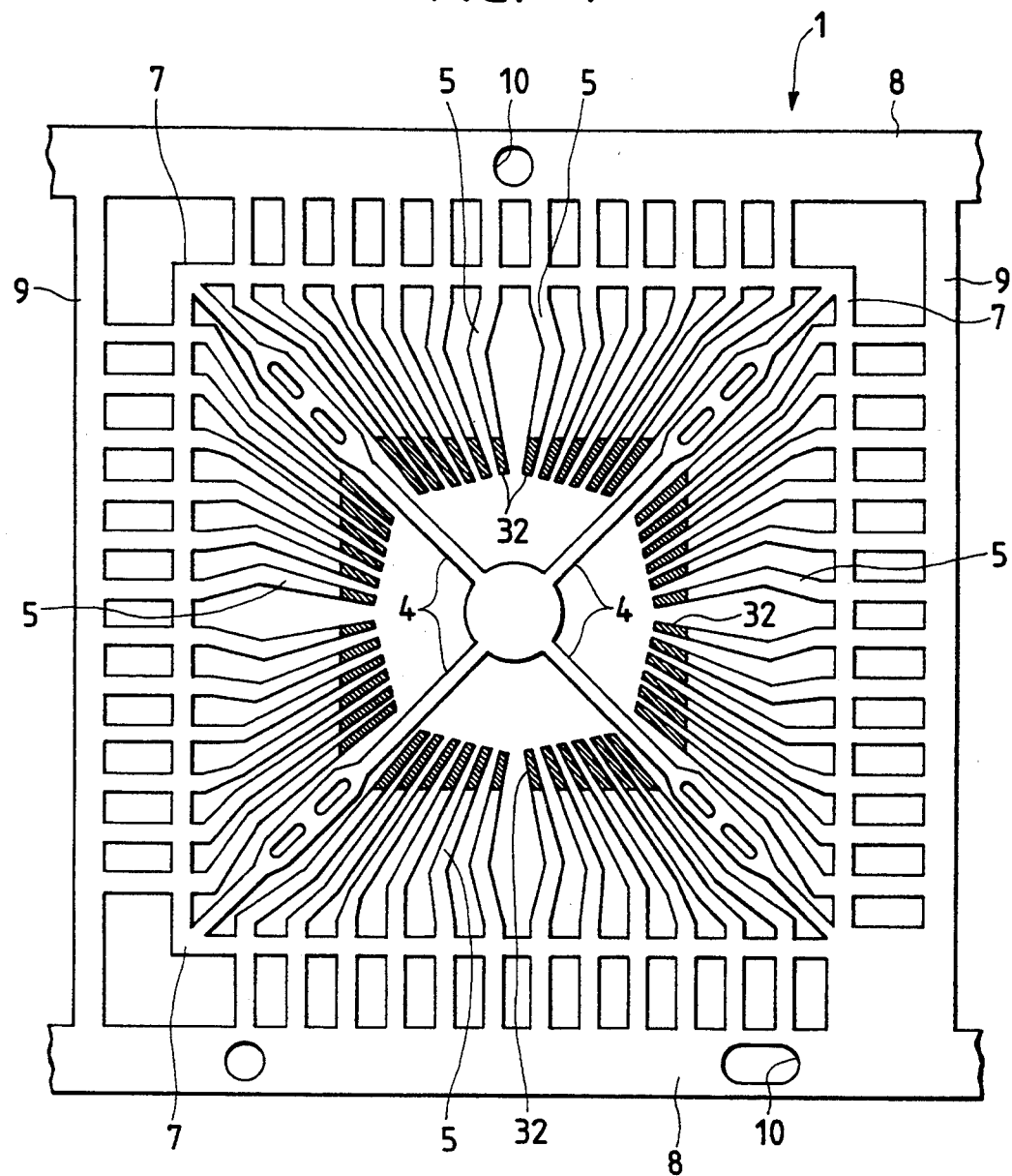
FIG. 4 is a top plan view showing a plating step of the leadframe of the present invention.

Next, as shown in FIG. 4, the wire bonding regions 32 of the inner lead portions 5a are plated with Ag. In the leadframe 1 of the present embodiment, as will be described hereinafter, the area of the regions to be plated with Ag is made larger than that of the leadframe of the prior art so that the leading ends of the leads 5 to be used as trimable lead regions which may be cut to a predetermined length in accordance with the external size of the semiconductor chip 2 to be mounted on the die pad 3. In the case of the prior art, for example, the distance from the leading ends of the inner leads could be within a range of about 1 mm while considering the wire bonding errors and the errors at the plating time. In the present invention, however, the distance has to be no less than 1 mm and 1.5 to 2 mm or more if the first cut and the second cut are considered.

Figure 5:
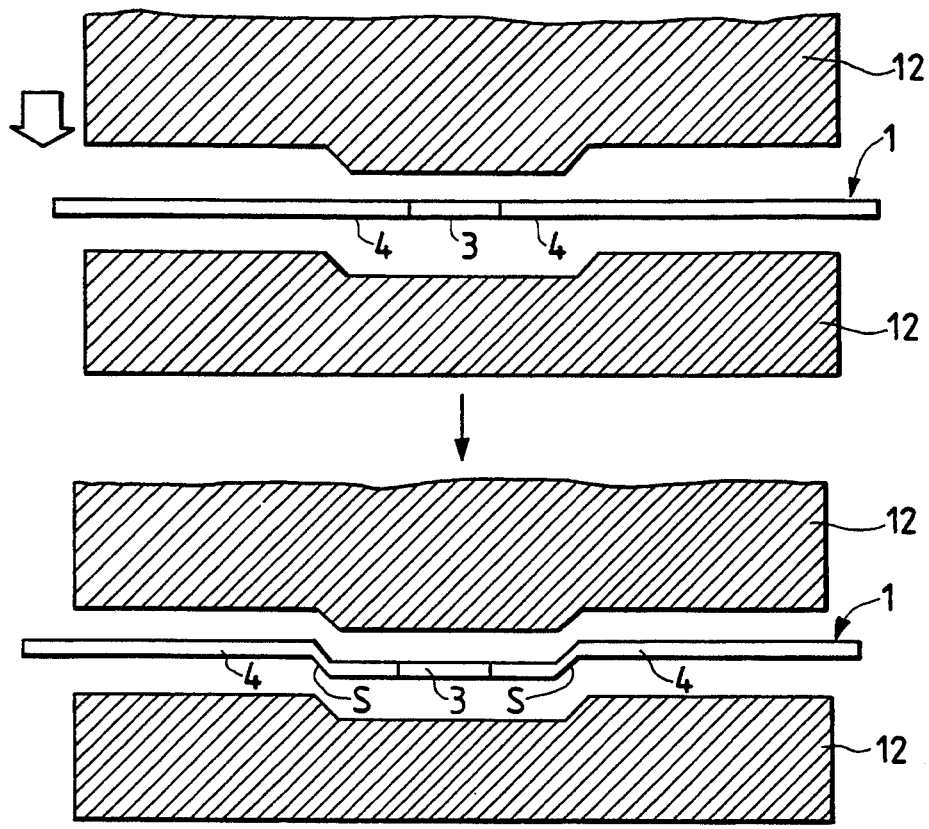
FIG. 5 is an explanatory diagram showing a down-setting step of the leadframe of the present invention.

Next, the leadframe 1 is subjected to a down-setting step. This down-setting step is a treatment to lower the height of the die pad 3 than that of the leads 5, as viewed horizontally, by bending the midway portions (as indicated at S in FIG. 5) of the suspension leads 4 downward while using a press mold 12, as shown in FIG. 5. Specifically, if the chip mounting face of the die pad 3 and the wire bonding face of the inner lead portions 5a are assumed a first face and if the face opposed to the first face is assumed a second face, the first face is positioned at the side of the second face rather than the first face of the inner lead portions 5a.

Figure 6:
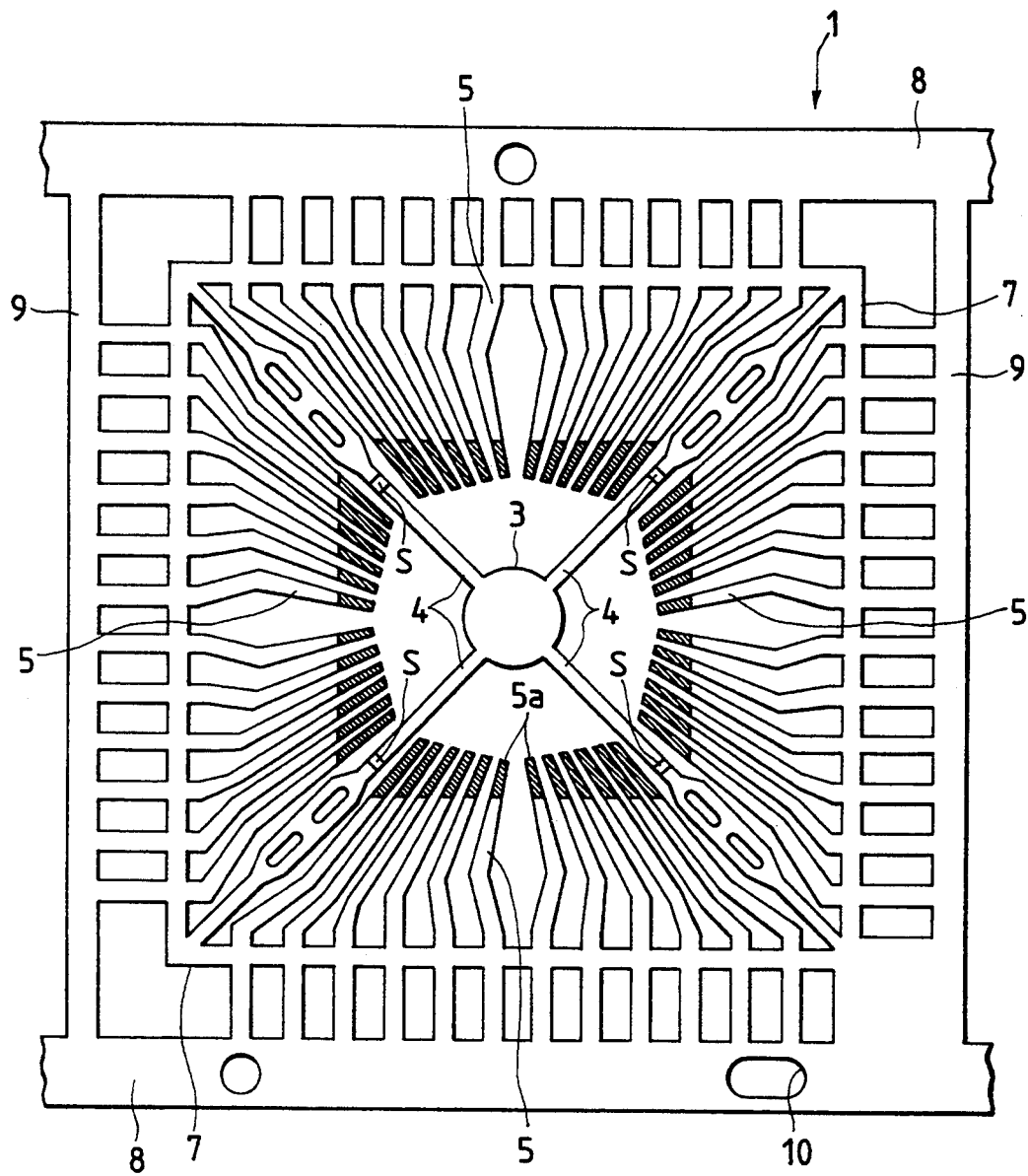
FIG. 6 is a top plan view showing the down-setting step of the leadframe of the present invention.

FIG. 6 is a top plan view showing the leadframe 1 which has been subjected to the down-setting treatment. For example, the distance from the center of the die pad 3 to the down-set position (S) of each suspension lead 4 is about 8.5 to 9.0 mm, and the depth of the down-set (i.e., the height from the principal face of the die pad 3 to the principal face of the leads 5) is about 0.2 mm.

Thanks to the aforementioned down-setting treatment, the resin thickness is substantially equalized at the upper face side of the semiconductor chip 2 and at the lower face side of the die pad 3 when a package is to be molded by fitting up a mold with the leadframe 1 having the semiconductor chip 2.

Next, the tape 6 is adhered to both the midway portions (i.e., wider portions) of the suspension leads 4 for supporting the die pad 3 and the inner lead portions 5a.

Figure 7:
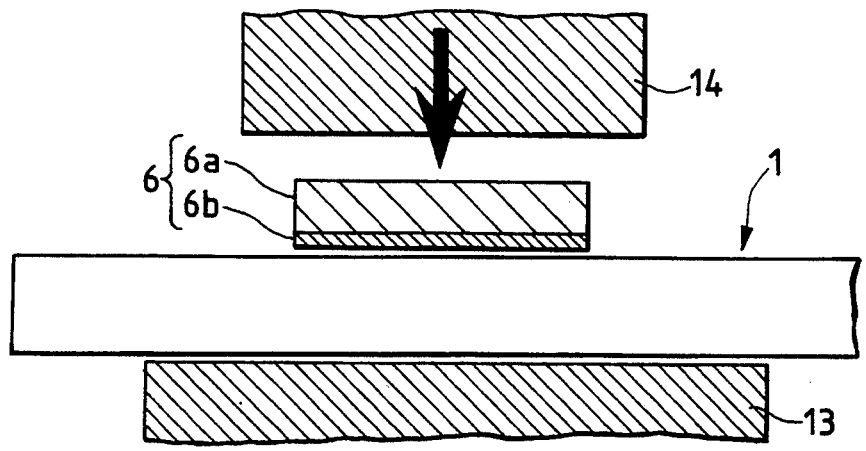
FIG. 7 is an explanatory diagram showing a tape adhering step of the leadframe of the present invention.

The adhesion of the tape 6 is carried out, as shown in FIG. 7, by positioning the tape 6 on the leadframe 1 placed on a heat stage 13 and by pushing a tool 14 downward.

For example, the tape 6 is constructed such that an adhesive 6b of an acrylic resin is applied to a thickness of about 0.02 mm onto one side of a film 6a of a polyimide resin having an external size of about 18.5 mm × 18.5 mm, a width of about 1.5 mm and a thickness of about 0.05 mm.

Figure 8:
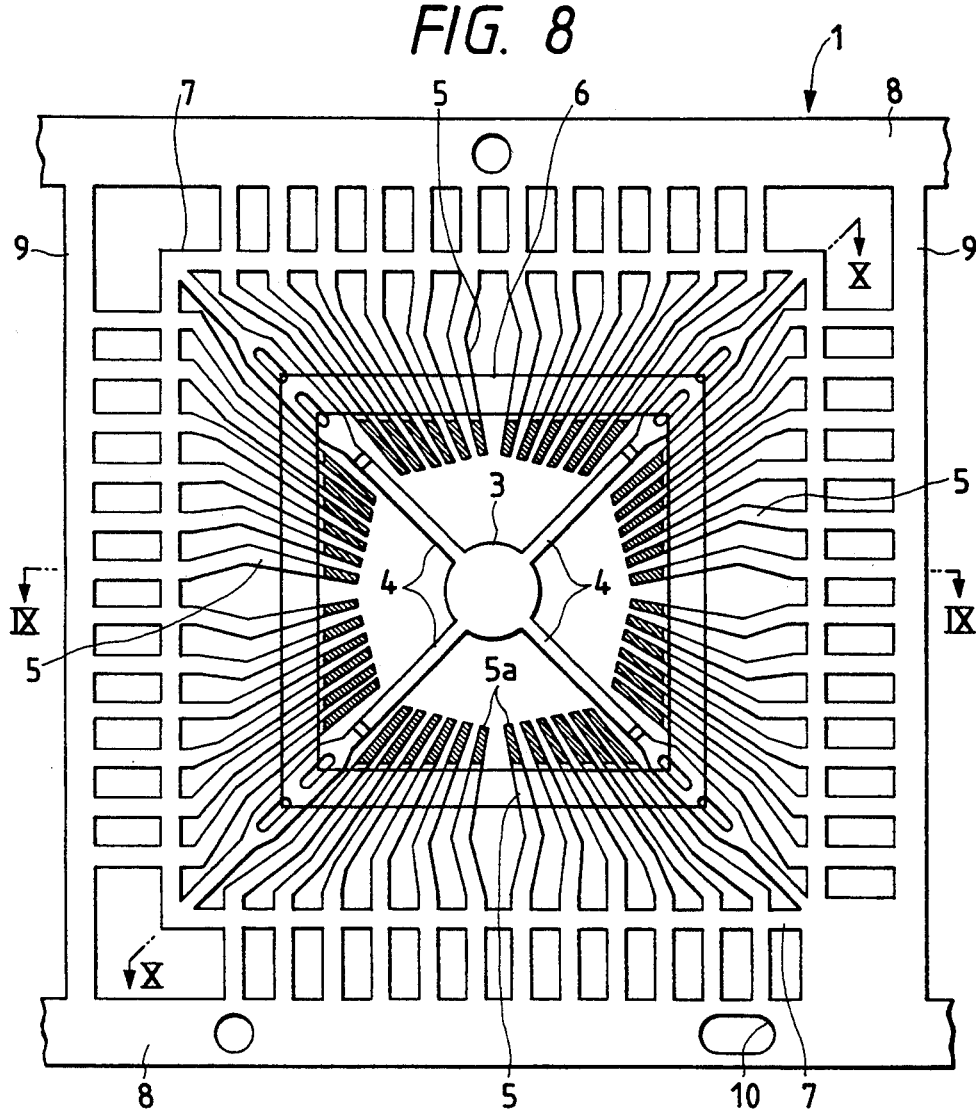
FIG. 8 is a top plan view showing the tape adhering step of the leadframe of the present invention.
Figure 9:
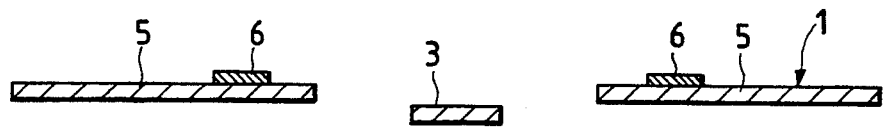
FIG. 9 is a section taken along line IX—IX of FIG. 8.
Figure 10:
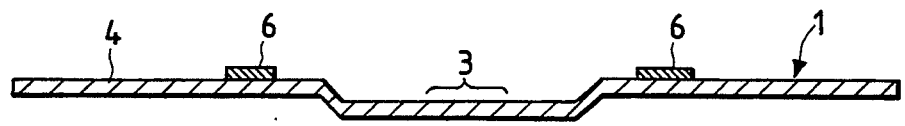
FIG. 10 is a section taken along line X—X of FIG. 8.

FIG. 8 is a top plan view showing the leadframe 1 having the tape 6 adhered thereto; FIG. 9 is a section taken along line IX—IX of FIG. 9; and FIG. 10 is a section taken along line X—X of FIG. 8. In order to retain the adhesion area of the tape 6, the suspension leads 4 are made wider at their midway portions (i.e., the widened portions of the suspension leads 4) than at other portions, as shown in FIG. 8.

When the leadframe 1 having the semiconductor chip 2 is attached to the mold to form the package body, the die pad 3 can be prevented, by adhering the tape 6, i.e., the insulating film to the midway portions of the suspension leads 4 to fix the die pad 3, from being fluctuated by the flow of the molten resin. As a result, the flow velocities of the molten resin can be equalized at the upper face side of the semiconductor chip 2 and the lower face side of the die pad 3 to prevent the molding defect such as through voids.

Since the leadframe 1 of the present embodiment thus achieved is constructed such that the area of the chip mounting face of the die pad 3 is smaller than that of either the principal face of the semiconductor chip 2 to be mounted thereon or the back face opposed to the aforementioned principal face, it can mount semiconductor chips having different external sizes thereon. By cutting the leading ends of the leads 5 to shorten them, moreover, it is possible to mount a semiconductor chip 2a or 2b having a larger area.

Figure 11A:
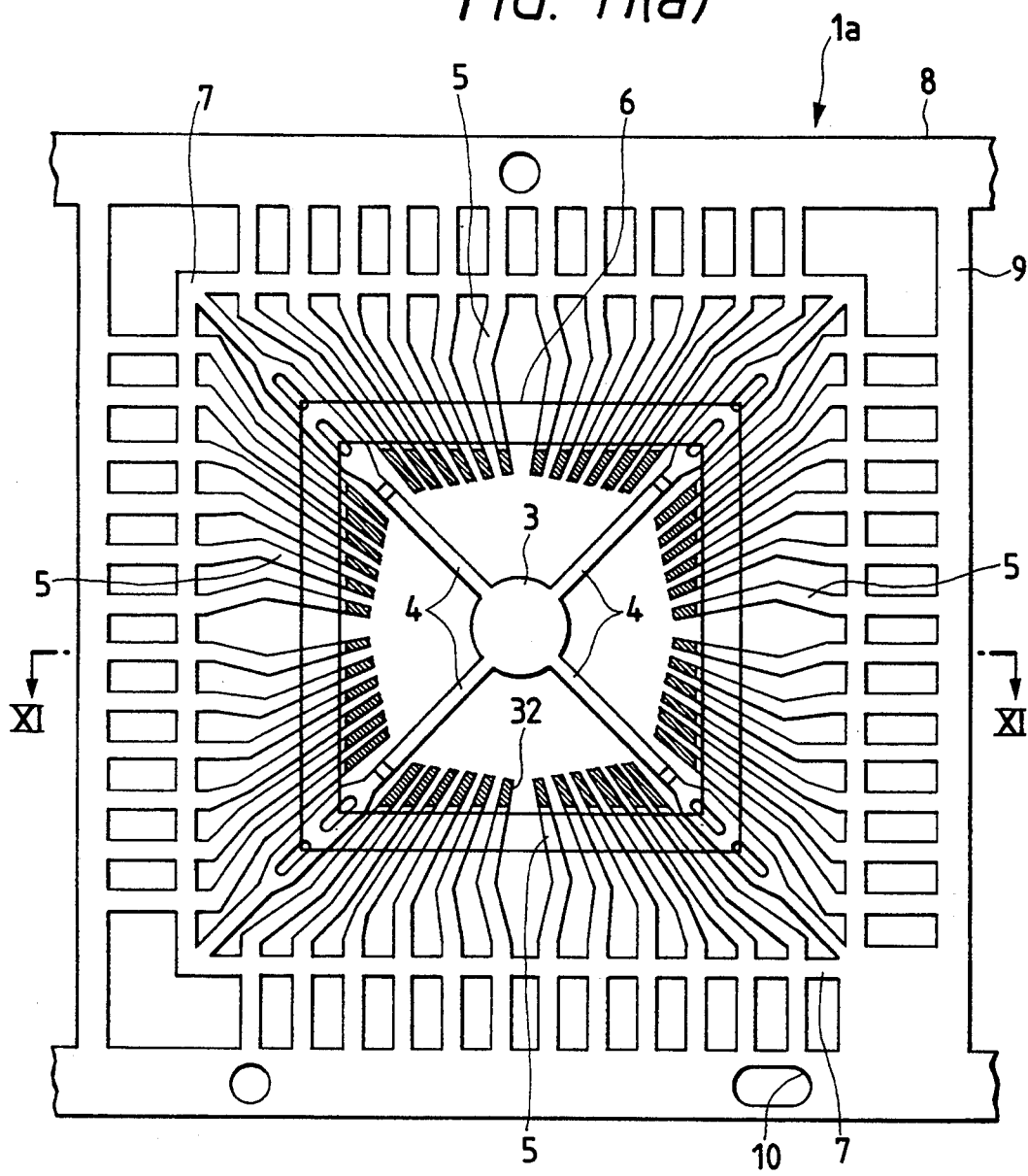
FIG. 11(a) is a top plan view showing a lead cutting step of the leadframe.
Figure 11B:
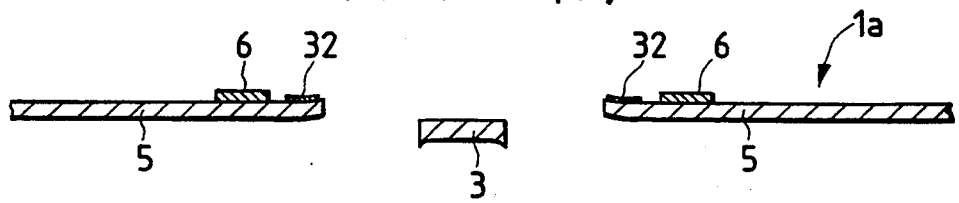
FIG. 11(b) is a section taken along line XI—XI of the same.
Figure 12:
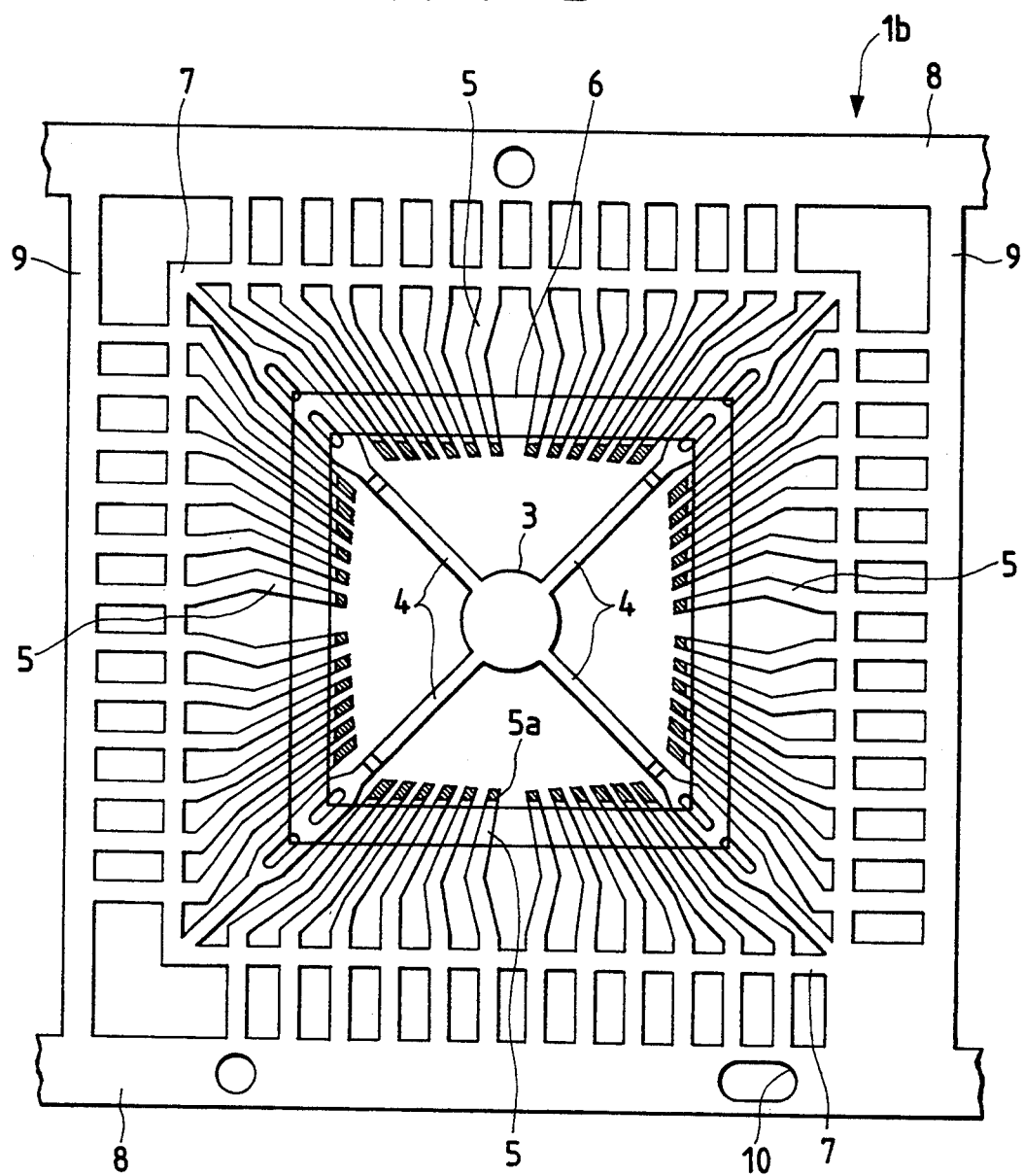
FIG. 12 is a top plan view showing the lead cutting step of the leadframe.

FIG. 11(a) is a top plan view showing a leadframe 1a in which the leading ends of the leads 5 are cut so as to mount the semiconductor chip 2a having a larger area than that of the semiconductor chip shown by double-dotted lines in FIG. 1, and FIG. 11(b) is a section taken along line XI—XI of FIG. 11(a). Broken lines appearing in FIG. 11(a) indicate the positions of the leading ends of the leads 5 before cut. FIG. 12 is a top plan view showing a leadframe 1b which has its leads 5 further cut at their leading ends. In this case, it is possible to mount the semiconductor chip 2b having a larger area than that of the semiconductor chip 2a.

Thus, in case the die pad 3 has a diameter of about 3 mm, for example, it is possible to mount a variety of semiconductor chips having external sizes ranging from about 5 mm × 5 mm to about 15 mm × 15 mm. The cutting step of the leads 5 is carried out by means of a press but with the wire bonding region being directed downward, so as to prevent the plated Ag layer from peeling from the wire bonding regions 32. As shown in FIG. 11(b), therefore, the molding is made with the leading ends of the inner lead portions 5a being directed upward.

Next, one embodiment of a process for fabricating a QFP by using the aforementioned leadframe 1 will be described with reference to FIGS. 13 to 30.

Figure 13:
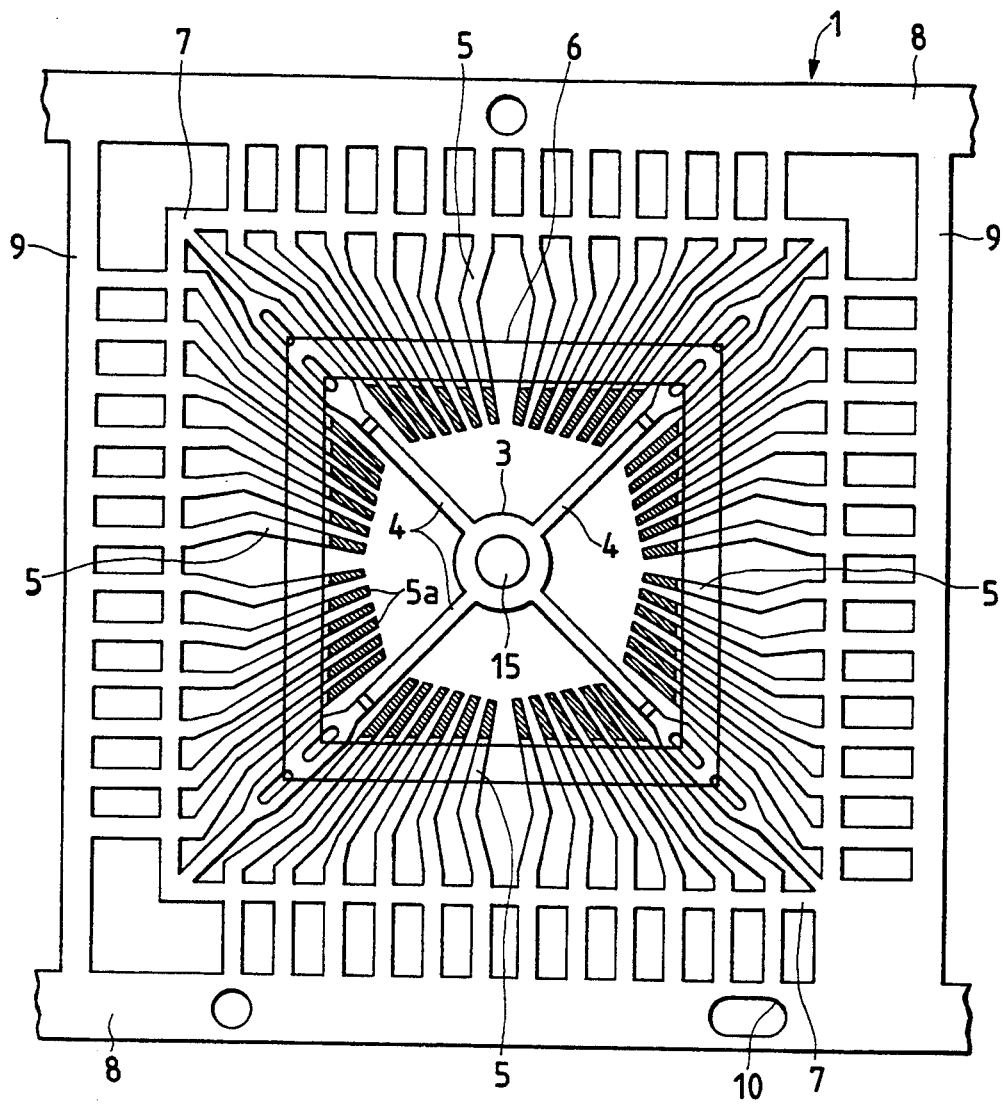
FIG. 13 is a top plan view showing an adhesive applying step of the leadframe.

First of all, as shown in FIG. 13, an adhesive 15 for adhering the semiconductor chip 2 is applied to the die pad 3 of the leadframe 1. Incidentally, FIG. 13 shows the leadframe 1 in which the leads 5 have their leading ends uncut. In case, however, the wider semiconductor chip 2a or 2b is to be mounted, the leading ends of the leads 5 are cut in advance to a predetermined length prior to the step of applying the adhesive 15 to the die pad 3. In short, the leadframe 1a or 1b is formed in advance. The cutting of the leading ends is carried out by considering that the leading ends of the inner leads 5a is positioned at a position at such a distance (e.g., 0.5 mm) or more apart from the outer periphery of a chip to be mounted as is kept away from being connected with that outer periphery.

Figure 14:
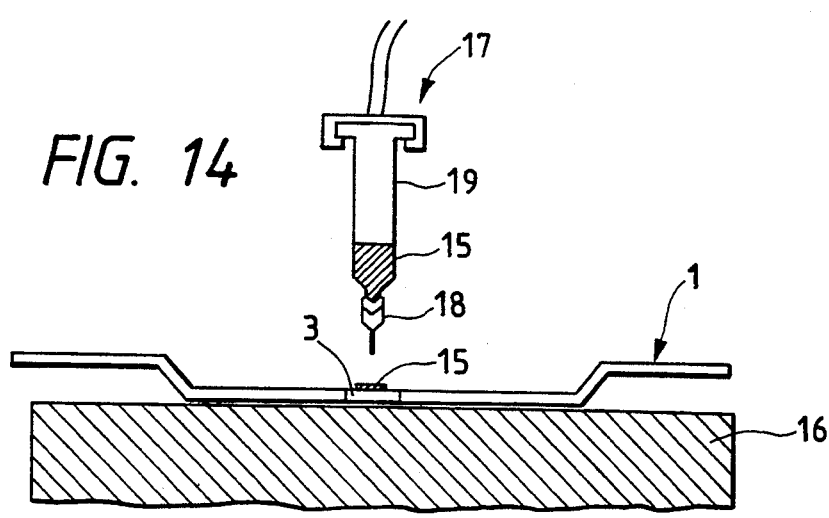
FIG. 14 is a section showing the adhesive applying step of the leadframe.

The application of the adhesive 15 is carried out, as shown in FIG. 14, by dropping the adhesive 15 onto the die pad 3 of the leadframe 1 placed on a stage 16, by means of a dispenser 17. The adhesive 15 is prepared by mixing Ag powder into a thermoset epoxy resin, for example. Incidentally, reference numerals 18 and 19 appearing in FIG. 14 designate a nozzle and a syringe, respectively. The die pad 3 may be sized to allow the adhesive 15 to be applied thereto.

Since the die pad 3 of the aforementioned leadframe 1 has a small area, the adhesive 15 may be applied to one point of the principal face of the die pad 3. This application results in such an advantage over the existing leadframe having a larger die pad that the structure of the nozzle 18 used may be simpler and that the application time of the adhesive 15 may be shorter.

Figure 15:
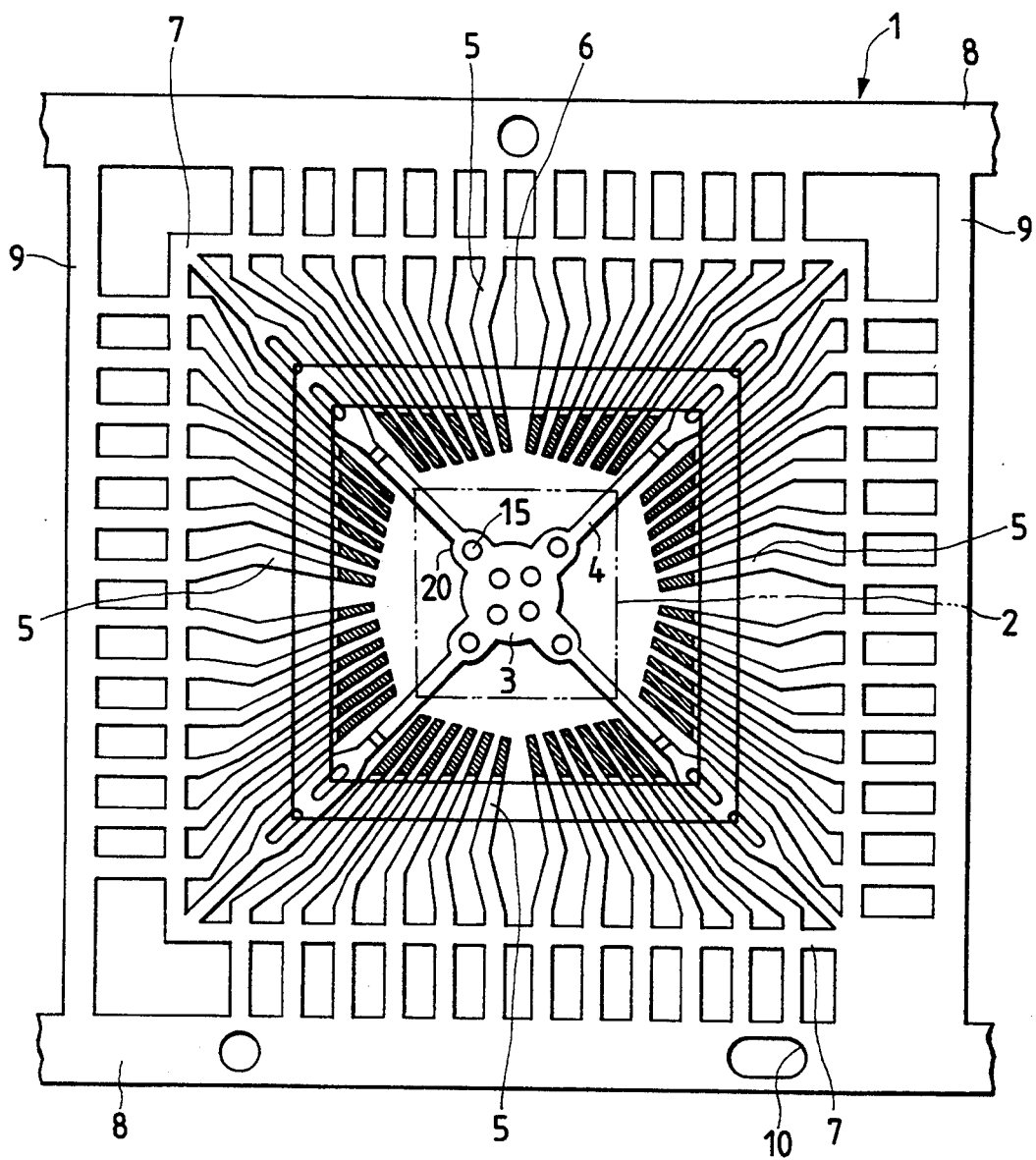
FIG. 15 is a top plan view showing the adhesive applying step of the leadframe.

As shown in FIG. 15, moreover, slightly wider small pads (or adhesion-applied portions) 20 than the suspension leads 4 may be formed around the die pad 3 so that the adhesive 15 may be applied to the individual principal faces of the die pad 3 and the small pads 20.

Since a sufficient adhesion strength is thus achieved, it is possible to prevent a disadvantage that the semiconductor chip 2 rotationally goes out of position over the die pad 3. Thanks to the formation of the small pads (i.e., adhesion-applied portions) 20, moreover, the rigidity of the suspension leads 4 can be substantially enhanced to prevent the die pad 3 from being fluctuated by the flow of the molten resin when the package is to be prepared by fitting up the mold with the leadframe 1 having the semiconductor chip 2 mounted thereon.

Figure 16:
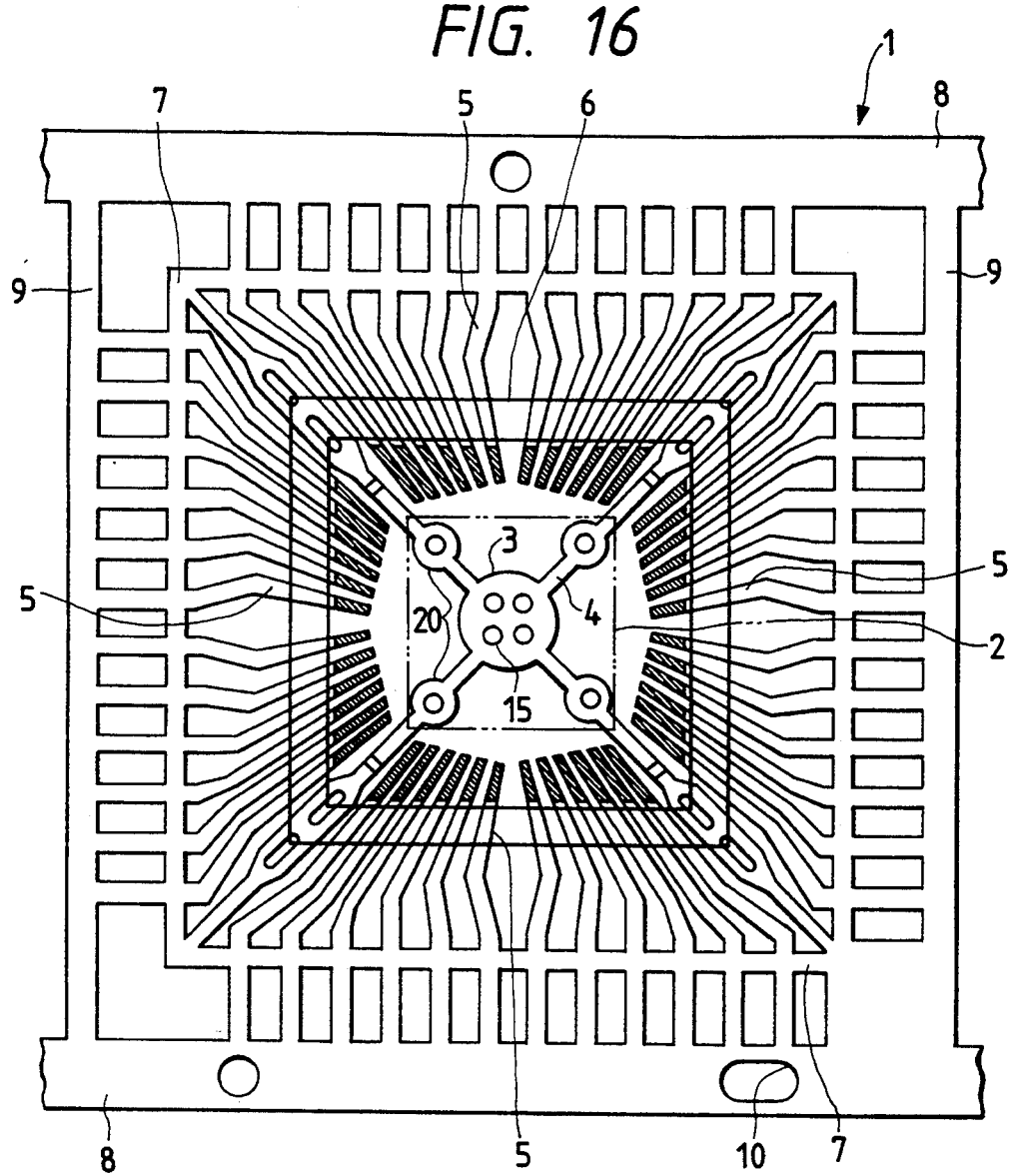
FIG. 16 is a top plan view showing the adhesive applying step of the leadframe.

The aforementioned small pads 20 may be formed midway of the individual suspension leads 4, namely, between the die pads 3 and the midway portions S, as shown in FIG. 16. Effects similar to the aforementioned ones can be achieved in this modification, too.

Figure 17:
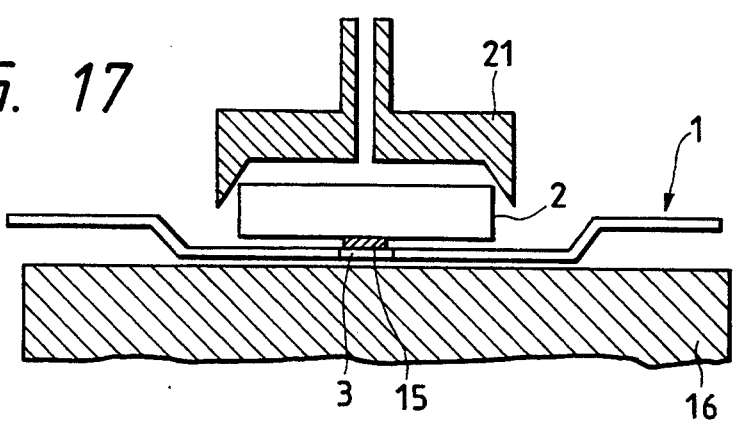
FIG. 17 is a section showing a chip mounting step of the leadframe.

Next, as shown in FIG. 17, the semiconductor chip 2 is positioned over the die pad 3 having the adhesive 15 applied thereto, by means of a collet 21. For example, the semiconductor chip 2 is made of single crystal silicon having an external size of about 5.34 mm × 5.34 mm and a thickness of about 0.4 mm.

Figure 18:
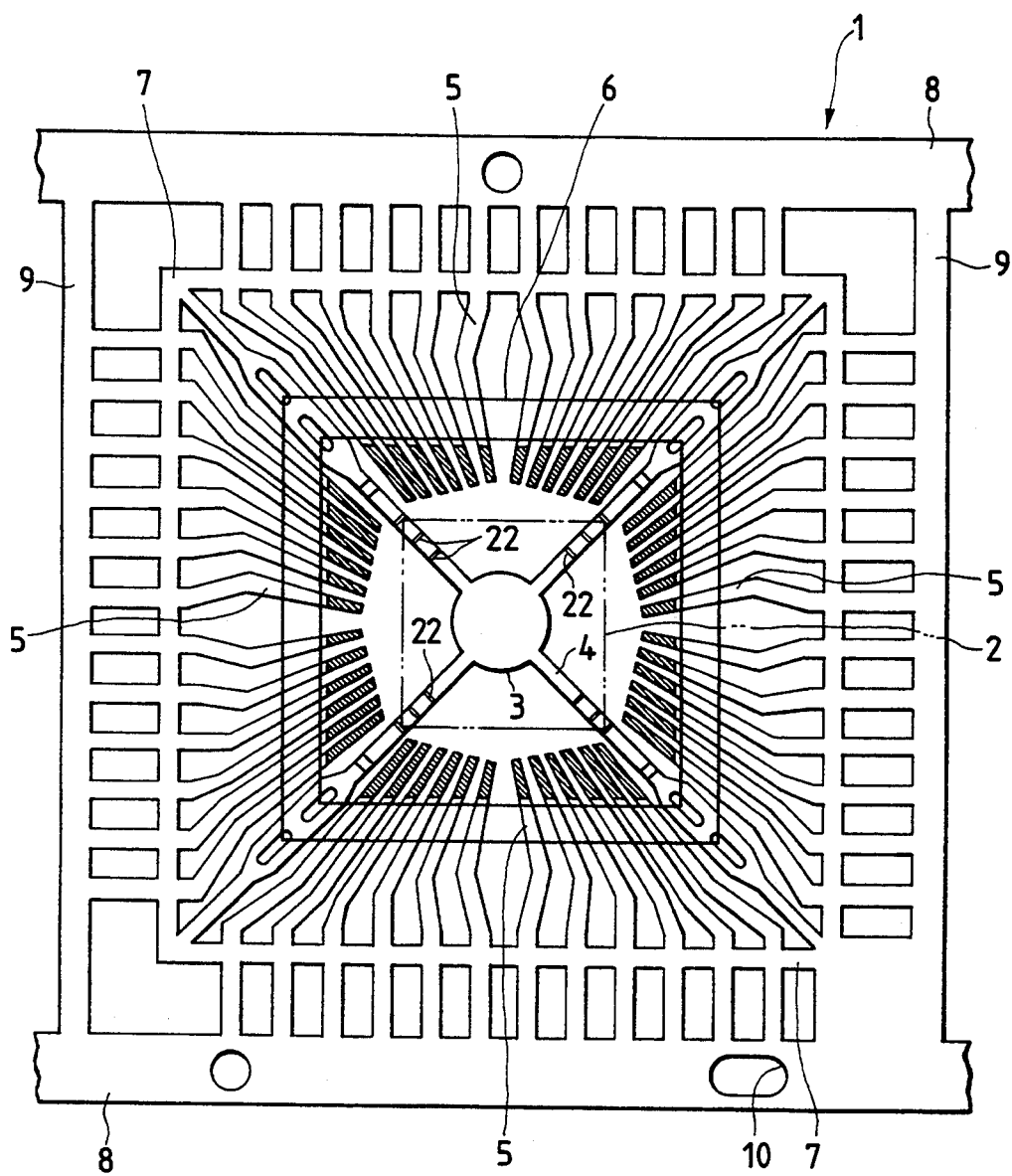
FIG. 18 is a top plan view showing the chip mounting step of the leadframe.
Figure 19:
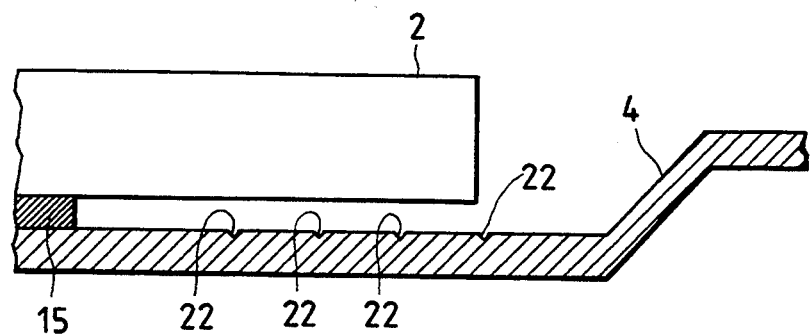
FIG. 19 is a partially enlarged section showing the chip mounting step of the leadframe.

FIG. 18 is a top plan view showing the leadframe 1 in which the suspension leads 4 supporting the die pad 3 is partially formed with V-shaped grooves 22. These V-shaped grooves 22 are used as graduations for positioning the semiconductor chip 2 accurately on the die pad 3 and are formed at a constant interval in the principal faces of the suspension leads 4, as shown in an enlarged section in FIG. 19.

Figures 20A, 20B, 20C:
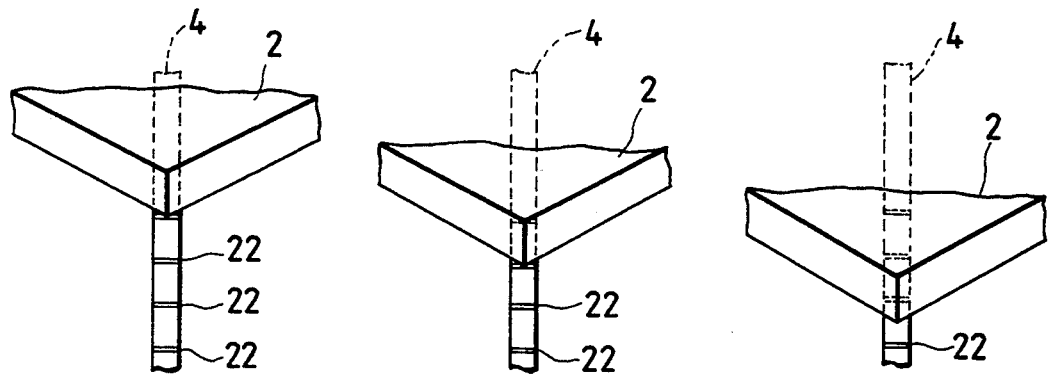
FIGS. 20(a) to 20(c) are partially enlarged perspective views showing the chip mounting step of the leadframe.

When the semiconductor chip 2 is to be positioned over the die pad 3, the locations of the V-shaped grooves 22 are detected from above the leadframe 1 by means of a (not-shown) camera, as shown in FIGS. 20(a) to 20(c). In accordance with these data, the semiconductor chips 2 having the various external sizes are moved to accurate positions.

Figure 21:
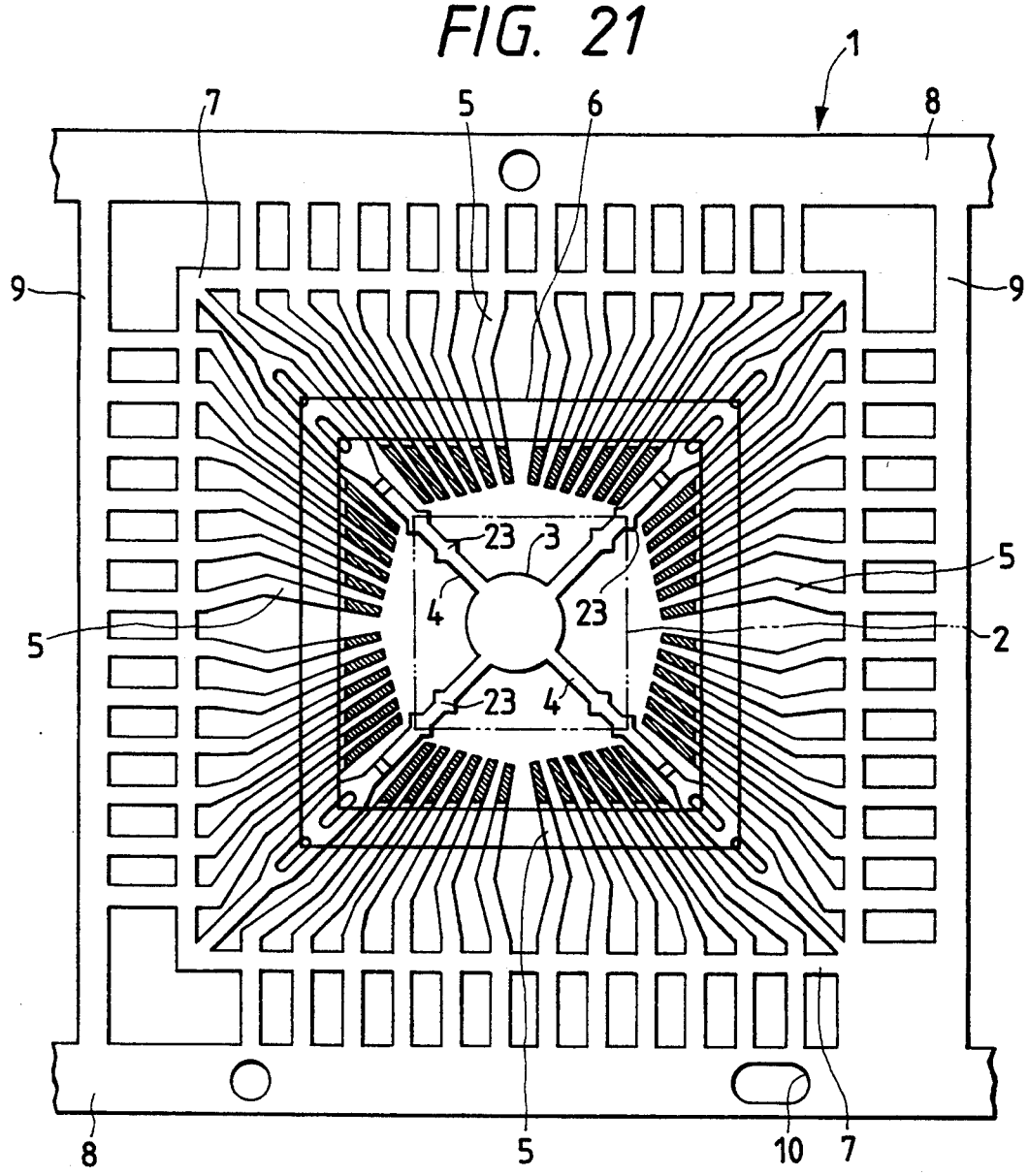
FIG. 21 is a top plan view showing the chip mounting step of the leadframe.

As shown in FIG. 21, on the other hand, a plurality of projections 23 may be formed at a constant interval midway of the individual suspension leads 4, i.e., between the die pad 3 and the midway portions S so that they may be used as the graduations for positioning the semiconductor chip 2 on the die pad 3. These V-shaped grooves 22 or projections 23 can be used at a visual inspection step after the semiconductor chip 2 have been positioned on the die pad 3.

Figure 22:
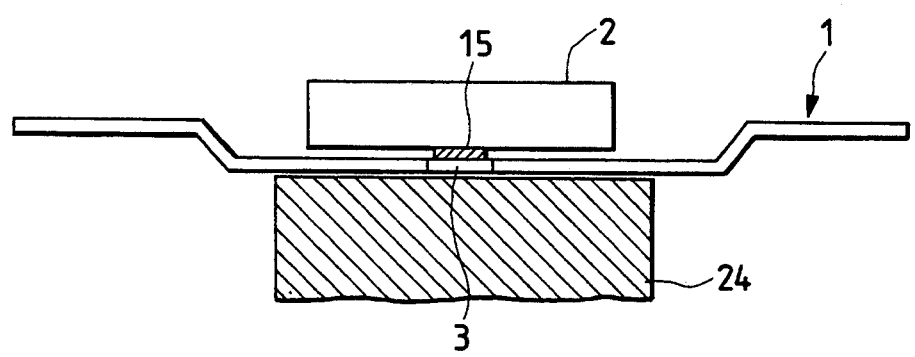
FIG. 22 is a section showing the chip mounting step of the leadframe.
Figure 23:
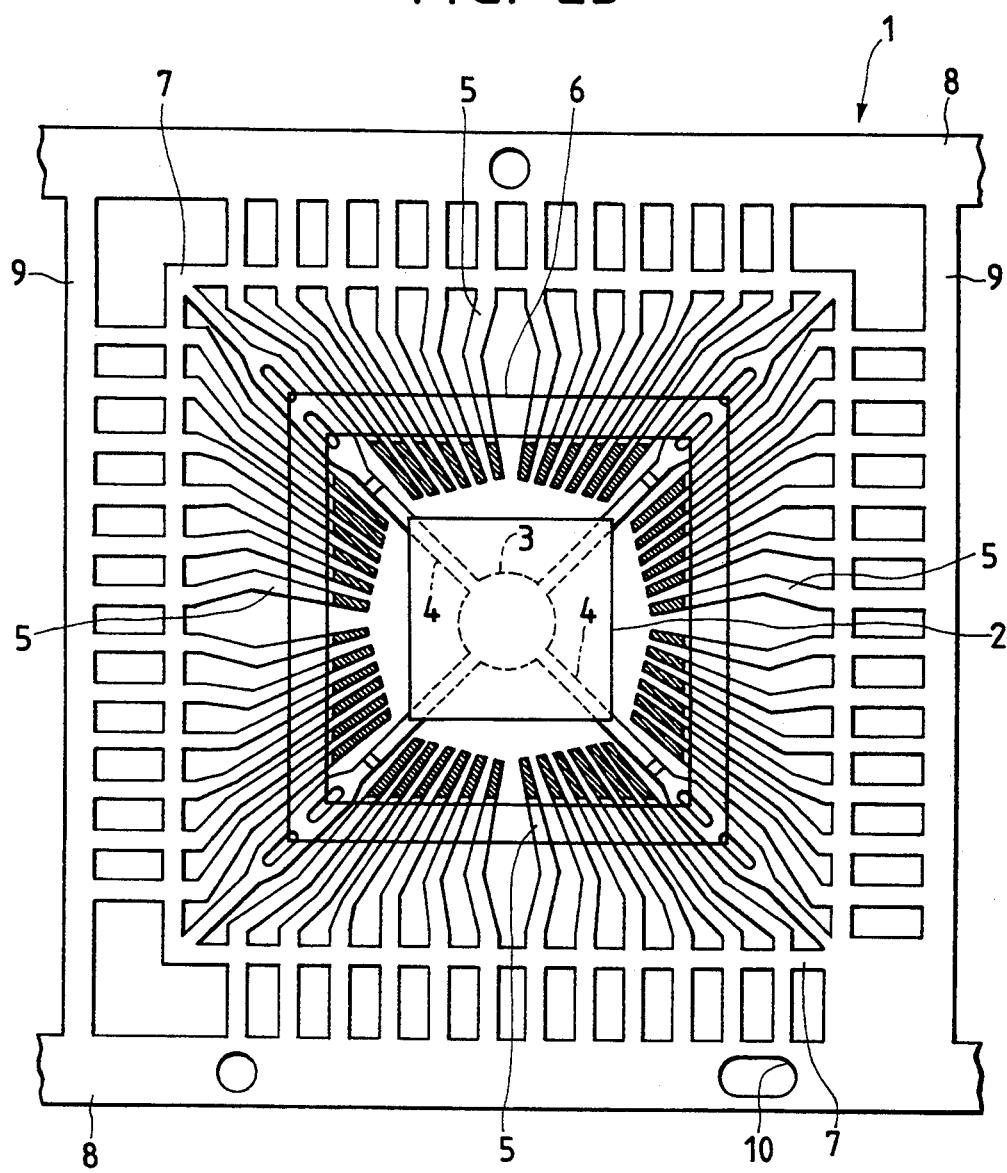
FIG. 23 is a top plan view showing the chip mounting step of the leadframe.

Next, as shown in FIG. 22, the leadframe 1 having the semiconductor chip 2 positioned on the die pad 3 is heated on a heat stage 24 to set the adhesive 15. The heating conditions are at a 200° to 250° C. and for about 30 secs. to 1 min., for example. Incidentally, the setting of the adhesive 15 can also be carried out by means of an oven. FIG. 23 is a top plan view showing the leadframe 1 which has finished the step of mounting the semiconductor chip 2 on the die pad 3.

Figure 24:
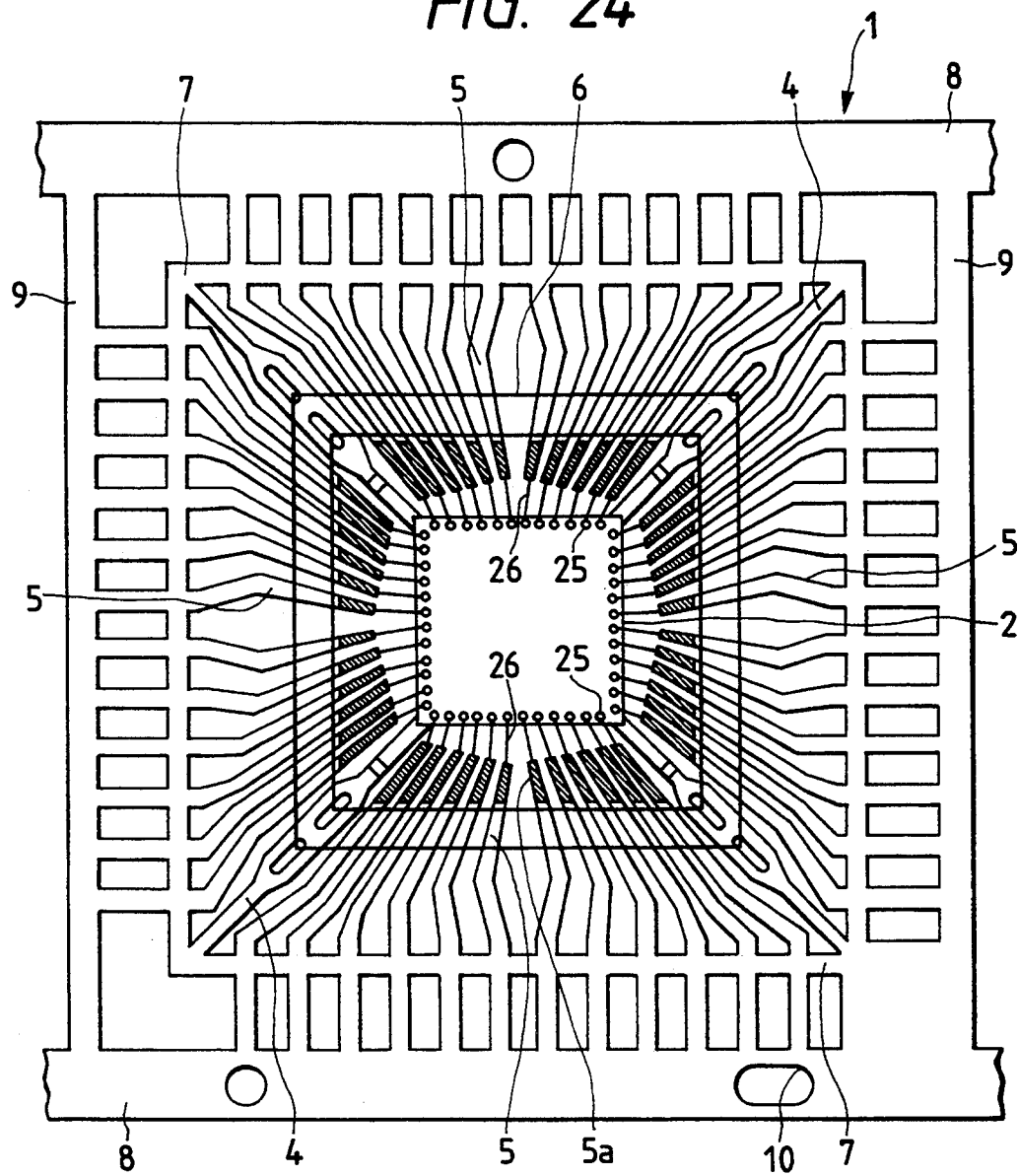
FIG. 24 is a top plan view showing a wire bonding step of the leadframe.
Figure 25:
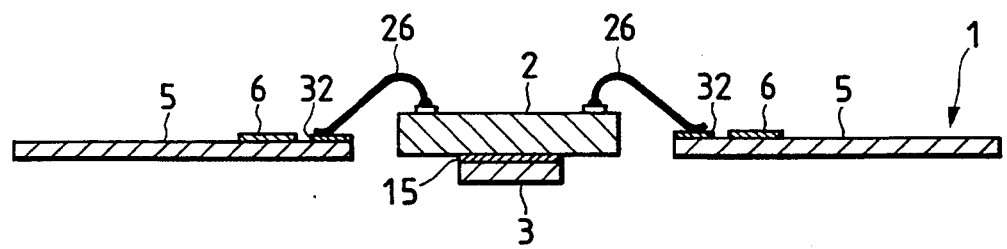
FIG. 25 is a section showing the wire bonding step of the leadframe.
Figure 26:
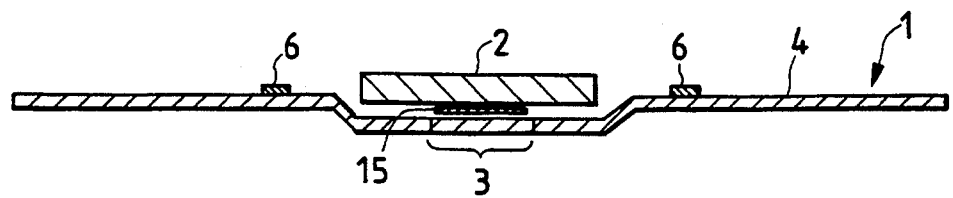
FIG. 26 is a section showing the wire bonding step of the leadframe.

Next, as shown in FIGS. 24 to 26, the semiconductor chip 2 mounted on the die pad 3 has its bonding pads 25 bonded to the leads 5 by means of wires 26 of Au to connect them electrically. FIG. 25 is a section showing the connected relation between the inner lead 5a and the semiconductor chip 2, and FIG. 26 is a section showing the relation between the suspension lead 4 and the semiconductor chip 2.

As shown in FIG. 24, the leadframe 1 of the present embodiment is arranged with the leading ends of the leads 5 in the shape of letter "V" along the individual sides of the semiconductor chip 2 (such that the leads 5 are made longer in the vicinity of the corner portions of the semiconductor chip 2, namely, close to the suspension leads 4 and shorter in the vicinity of the central portions of the individual sides, namely, at a distance from the suspension leads 4). As a result, lengths of the wires 26 are substantially equalized between all the bonding pads 25 and the leads 5 so that they need not be changed to make the wire bonding work easy.

Figure 27:
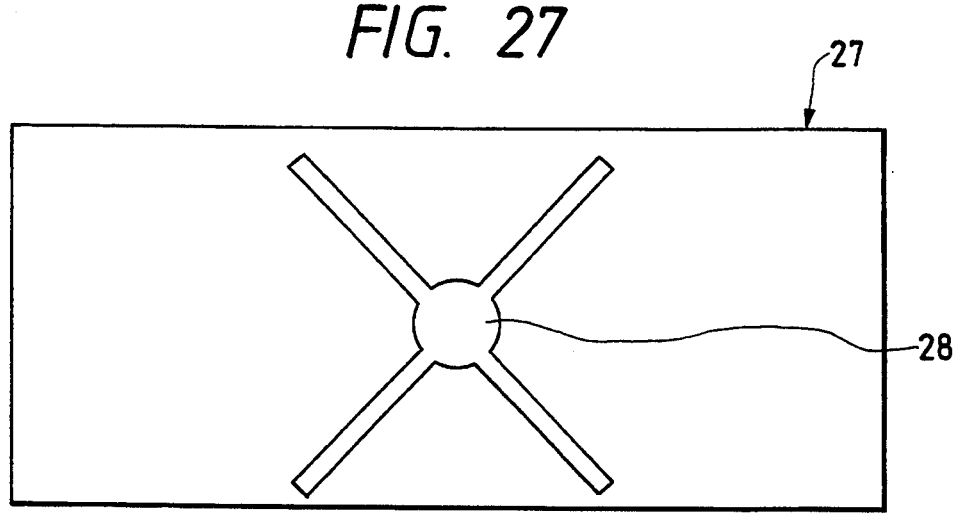
FIG. 27 is a top plan view showing a heat stage of a wire bonding apparatus.

FIG. 27 is a top plan view showing the principal face of a heat stage of the wire bonding apparatus to be used in the present embodiment. This heat stage 27 is formed with relief grooves 28 in which are to be fitted the die pad 3 and the portions (i.e., the inner portions of the aforementioned down-set positions (S)) of the suspension leads 4 of the leadframe 1.

Figure 28A:
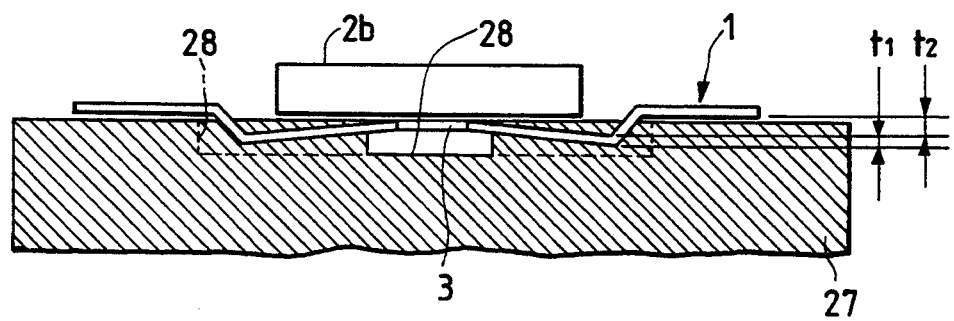
FIGS. 28(a) and 28(b) are sections showing the heat stage of the wire bonding apparatus.
Figure 28B:
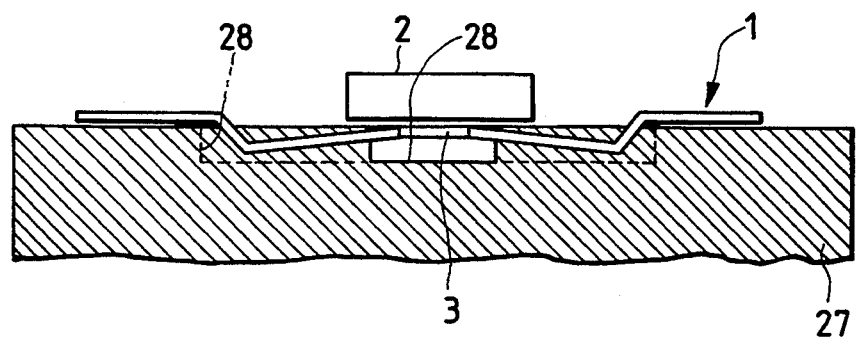

Since the heat stage 27 is formed in its principal face with the aforementioned relief grooves 28, either the leadframe 1 (as shown in FIG. 28(a)) having the large semiconductor chip 2b mounted on the die pad 3 or the leadframe 1 (as shown in FIG. 28(b)) having the small semiconductor chip 2 mounted can be wire-bonded to eliminate the troubles of replacing the heat stage 27 each time the external sizes of the semiconductor chip 2 change. Incidentally, reference characters $t_1$ appearing in FIG. 28(a) indicate the thickness (e.g., about 0.15 mm in the present embodiment) of the leadframe 1, and characters $t_2$ indicate the amount of down-set (e.g., about 0.2 mm in the present embodiment) of the die pad 3. The wire length is about 1.0 to 5.0 mm, as taken in a linear distance, from the bonding pads to the bonding points of the inner lead portions 5a.

Figure 29:
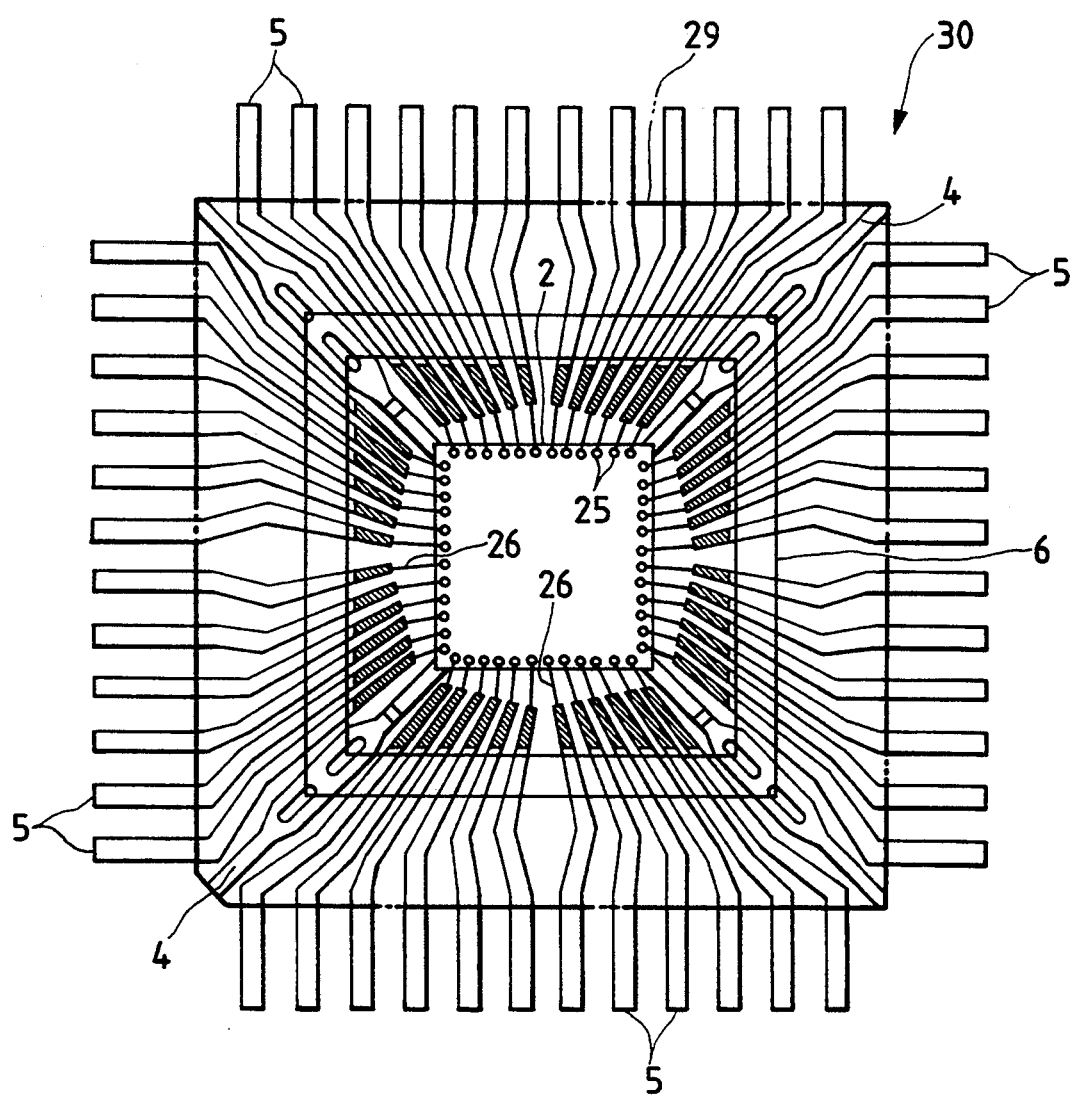
FIG. 29 is a top plan view showing a QFP using the leadframe of the present invention.
Figure 30:
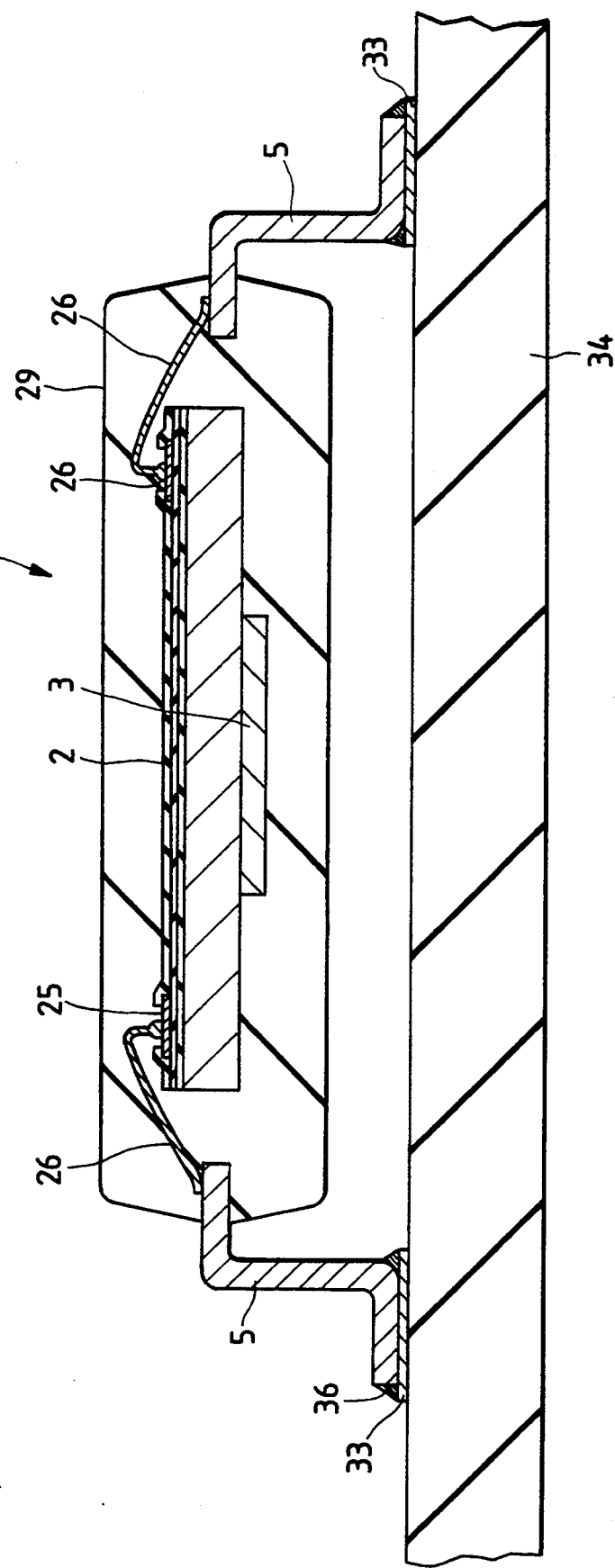
FIG. 30 is a section showing the QFP using the leadframe of the present invention.

Next, the aforementioned leadframe 1 is fitted in the mold, and the semiconductor chip 2, the die pads 3, the inner lead portions 5a and the wires 26 are molded of an epoxy resin, as shown in FIGS. 29 and 30, into a package body 29. After this, the unnecessary portions of the leadframe 1, that is, the dam bar 7, the outer frame 8 and the inner frame 9 exposed to the outside of the package body 29 are cut away by means of a press. Finally, the leads 5 left at the outside of the package body 29 are shaped into a predetermined shape to complete a QFP type surface-mounting semiconductor device 30. Then, this QFP type surface-mounting semiconductor device 30 is mounted over a wiring substrate 84 by the fellow soldering method. Numeral 33 designates land pads for placing the leads 5 thereon, and numeral 36 designates the solder.

Since the QFP 30 thus fabricated by using the leadframe 1 of the present embodiment has its die pad 3 made smaller than the semiconductor chip 2 mounted thereon, the peripheral portion of the semiconductor chip 2 has its back contacting closely to the sealing resin.

Since the adhesion of the interface between the sealing resin and the die pad 3 is sufficient, the interface can be suppressed from peeling even if it should be expanded by the moisture having invaded and been heated at the reflow soldering step. Thus, it is possible to provide the QFP 30 having an improved reflow cracking resistance.

Moreover, since the leadframe 1 of the present embodiment can mount a variety of semiconductor chips 2 of different external sizes, the troubles of preparing a leadframe for each of the semiconductor chips having different external sizes are eliminated. As a result, the leadframe 1 can be standardized to reduce its production cost thereby to provide the QFP 30 at a reasonable cost.

Still moreover, since the leadframe 1 of the present embodiment reduces the external size of the die pad 3, the amount of the adhesive 15 to be used for mounting the semiconductor chip 2 on the die pad 3 can also be reduced to provide the QFP 30 at a more reasonable cost.

Although our invention has been specifically described in connection with the embodiments thereof, it should not be limited to the foregoing embodiments but can naturally be modified in various manners without departing from the gist thereof.

Figure 31:
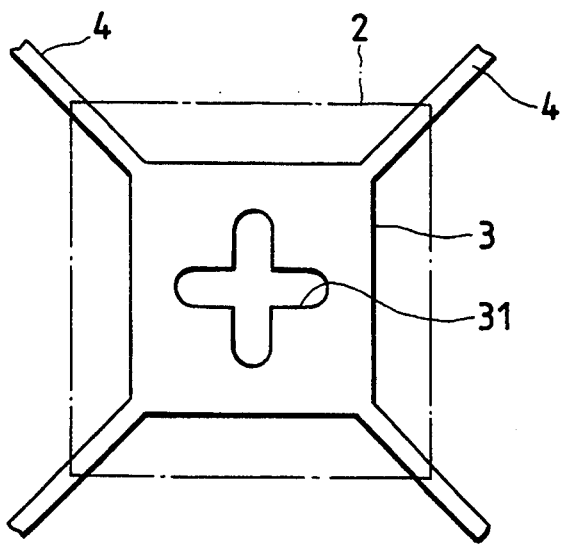
FIG. 31 is a partially enlarged top plan view showing another embodiment of the die pad portion of the leadframe.

The shape of the die pad should not be limited to the circle but may be another such as a rectangle, if the adhering strength of the chip to the die pad and the minimum application region of the adhesive are retained. As shown in FIG. 31, moreover, the package cracking resistance at the reflow soldering can be better improved by forming a through hole 31 in a, portion of the die pad 3 having a smaller area than that of the semiconductor chip 2 to increase the adhesion area between the semiconductor chip 2 and the resin.

Figure 32:
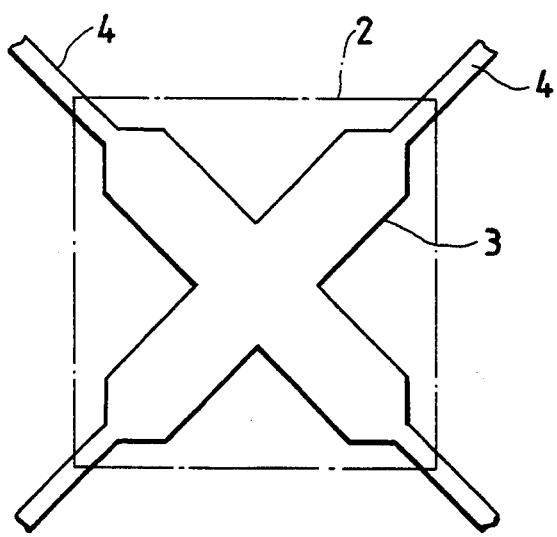
FIG. 32 is a partially enlarged top plan view showing still another embodiment of the die pad portion of the leadframe.

As shown in FIG. 32, still moreover, the intersections of the four suspension leads 4 may be widened to use this wide area as the die pad 3.

In the foregoing embodiments, the present invention has been described in case it is applied to the leadframe for fabricating the QFP, but can also be applied generally to the leadframes to be used for assembling the surface-mounting LSI package. The present invention can also be applied to a leadframe to be used for fabricating a pin-inserted LSI package such as DIP (i.e., Dual In-line Package).

The effects to be achieved by the representatives of the invention disclosed herein will be briefly summarized in the following:

(1) According to the present invention, it is possible to provide an LSI package having an improved reflow cracking resistance; and (2) According to the present invention, a leadframe matching the flexible manufacturing system of the LSI package can be provided to reduce the production cost of the LSI package.

What is claimed is:

1. A process for fabricating a semiconductor integrated circuit device by using a leadframe capable of mounting a plurality of kinds of semiconductor chips having different sizes thereon, comprising the steps of:
   preparing said leadframe having a first face and a second face, said leadframe including a chip mounting portion for mounting any semiconductor chip of said plurality of kinds of semiconductor chips, a plurality of chip suspension leads supporting said chip mounting portion, a plurality of inner lead portions arranged to surround said chip mounting portion and having trimable lead regions capable of being cut according to a size of a semiconductor chip to be mounted, and outer lead portions individually connected with said inner lead portions, and said first face of said chip mounting portion and said chip suspension leads have a different level from said first face of said inner lead portions;
   preparing a selected semiconductor chip from said plurality of kinds of semiconductor chips and which has a principal face formed with an integrated circuit and a plurality of bonding pads, wherein a size of said selected semiconductor chip is larger than that of said chip mounting portion of said leadframe;
   bonding said selected semiconductor chip to said chip mounting portion;
   electrically connecting said bonding pads and said inner lead portions individually; and
   sealing said selected semiconductor chip, said inner lead portions and said chip mounting portion,
   wherein end portions of said inner lead portions are cut at said trimable lead regions to substantially correspond to said size of said selected semiconductor chip.

2. A process for fabricating a semiconductor integrated circuit device according to claim 1,
   wherein an insulating layer for supporting said inner lead portions and said chip suspension leads is continuously formed to extend from said inner lead portions to said chip suspension leads.

3. A process for fabricating a semiconductor integrated circuit device according to claim 1, further comprising the steps of:
   applying an adhesive to said chip mounting portion; and
   bonding said semiconductor chip to said chip mounting portion through said adhesive.

4. A process for fabricating a semiconductor integrated circuit device according to claim 1,
   wherein a plurality of adhesive applied portions are formed on at least one of said chip mounting portion and said chip suspension leads.

5. A process for fabricating a semiconductor integrated circuit device according to claim 4, further comprising the steps of:
   applying an adhesive to said chip mounting portion and said adhesive applied portions; and
   bonding said semiconductor chip and said chip mounting portion through said adhesive.

6. A process for fabricating a semiconductor integrated circuit device according to claim 1,
   wherein said plurality of chip suspension leads has four chip suspension leads each formed with a plurality of positioning grooves.

7. A process for fabricating a semiconductor integrated circuit device according to claim 6, further comprising the steps of:
   detecting locations of said positioning grooves to determine a bonding position of said semiconductor chip in terms of said positioning grooves; and
   bonding said semiconductor chip to said chip mounting portion in accordance with a detected said bonding position.

8. A process for fabricating a semiconductor integrated circuit device according to claim 1,
   wherein said plurality of chip suspension leads has four chip suspension leads each formed with a plurality of positioning projections.

9. A process for fabricating a semiconductor integrated circuit device according to claim 8, further comprising the steps of:
   detecting locations of said positioning projections to determine a bonding position of said semiconductor chip in terms of said positioning projections; and
   bonding said semiconductor chip to said chip mounting portion in accordance with a detected said bonding position.

10. A process for fabricating a semiconductor integrated circuit device according to claim 1,
    wherein ones of said inner lead portions are made longer at a position close to said chip suspension leads than at a position remote from said chip suspension leads.

11. A process for fabricating a semiconductor integrated circuit device according to claim 1,
    wherein at said electrically connecting step, said leadframe having said semiconductor chip mounted thereon is wire-bonded while being placed on a heat stage for a wire bonding operation.

12. A process for fabricating a semiconductor integrated circuit device according to claim 11,
    wherein at said electrically connecting step, said heat stage has accommodation grooves for accommodating said chip mounting portion and said chip suspension leads during said wire bonding operation, and said chip mounting portion and said chip suspension leads are fitted in said groove.

13. A process for fabricating a semiconductor integrated circuit device comprising the steps of:
   preparing a leadframe having a first face and a second face, said leadframe including a chip mounting portion for mounting a semiconductor chip, a plurality of chip suspension leads supporting said chip mounting portion, a plurality of inner lead portions arranged to surround said chip mounting portion and having trimable lead regions capable of being cut according to a size of a semiconductor chip to be mounted, and outer lead portions individually connected with said inner lead portions;
   bending said chip mounting portion and each of said chip suspension leads in a direction from said first face to said second face, wherein said chip suspension leads are bent at a bending portion so that said first face of said chip mounting portion and said chip suspension leads is disposed in a chip mounting plane which is different from an inner lead plane of said first face of said inner lead portions;
   preparing a selected semiconductor chip of a plurality of kinds of semiconductor chips having different sizes and having a principal face formed with an integrated circuit and a plurality of bonding pads, wherein a size of said selected semiconductor chip is larger than that of said chip mounting portion of said leadframe;
   bonding said semiconductor chip to said chip mounting portion;
   electrically connecting said bonding pads and said inner lead portions while being placed on a heat stage having at least one accommodation groove for accommodating said chip mounting portion and said chip suspension leads during a wire bonding operation, said chip mounting portion and said suspension leads are fitted in said groove; and
   sealing said semiconductor chip, said inner lead portions and said chip mounting portion.

14. A process for fabricating a semiconductor integrated circuit device according to claim 13,
   wherein a depth of said accommodation groove is larger than that of said bending portion of said suspension leads.

15. A process for fabricating a semiconductor integrated circuit device according to claim 13,
   wherein an insulating layer for supporting said inner lead portions and said chip suspension leads is continuously formed to extend from said inner lead portions to said chip suspension leads.

16. A process for fabricating a semiconductor integrated circuit device according to claim 13, further comprising the steps of:
   applying an adhesive to said chip mounting portion; and
   bonding said semiconductor chip to said chip mounting portion through said adhesive.

17. A process for fabricating a semiconductor integrated circuit device according to claim 13,
   wherein a plurality of adhesive applied portions are formed on at least one of said chip mounting portion and said chip suspension leads.

18. A process for fabricating a semiconductor integrated circuit device according to claim 17, further comprising the steps of:
   applying an adhesive to said chip mounting portion and said adhesive applied portions; and
   bonding said semiconductor chip and said chip mounting portion through said adhesive.

19. A process for fabricating a semiconductor integrated circuit device according to claim 13,
   wherein said plurality of chip suspension leads has four chip suspension leads each formed with a plurality of positioning grooves.

20. A process for fabricating a semiconductor integrated circuit device according to claim 19, further comprising the steps of:
   detecting locations of said positioning grooves to determine a bonding position of said semiconductor chip in terms of said positioning grooves; and
   bonding said semiconductor chip to said chip mounting portion in accordance with a detected said bonding position.

21. A process for fabricating a semiconductor integrated circuit device according to claim 13,
   wherein said plurality of chip-suspension leads has four chip suspension leads each formed with a plurality of positioning projections.

22. A process for fabricating a semiconductor integrated circuit device according to claim 21, further comprising the steps of:
   detecting a boding location of said semiconductor chip in terms of said positioning projections; and
   bonding said semiconductor chip to said chip mounting portion in accordance with a detected said bonding location.

23. A process for fabricating a semiconductor integrated circuit device according to claim 13,
   wherein ones of said inner lead portions are made longer at a position close to said chip suspension leads than at a position remote from said chip suspension leads.

* * * * *